(12) United States Patent (10) Patent No.: US 8,120,087 B2
Sashida (45) Date of Patent: Feb. 21, 2012

(54) FERROELECTRIC CAPACITOR WITH UNDERLYING CONDUCTIVE FILM

(75) Inventor: Naoya Sashida, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 98 days.

(21) Appl. No.: 12/495,211

(22) Filed: Jun. 30, 2009

(65) Prior Publication Data

US 2010/0001325 A1 Jan. 7, 2010

(30) Foreign Application Priority Data

Jul. 1, 2008 (JP) ................................. 2008-172166

(51) Int. Cl.
*H01L 27/108* (2006.01)

(52) U.S. Cl. ................. 257/310; 257/295; 257/E21.664; 257/E27.104; 438/240

(58) Field of Classification Search .................. 257/295, 257/296, 310, 765, E21.011, E29.343, E27.104, 257/E21.664; 438/240, 253, 381, 396, 399
See application file for complete search history.

(56) References Cited

U.S. PATENT DOCUMENTS

| | | | | |
|---|---|---|---|---|
| 5,426,000 A * | 6/1995 | Labib et al. | ............ | 428/547 |
| 6,146,993 A * | 11/2000 | Brown et al. | ........... | 438/627 |
| 6,620,721 B1 * | 9/2003 | Lee | ............... | 438/612 |
| 7,180,122 B2 * | 2/2007 | Mikawa et al. | ......... | 257/310 |
| 7,407,862 B2 * | 8/2008 | Tamura | .......... | 438/396 |
| 7,514,272 B2 * | 4/2009 | Fukada et al. | ........... | 438/3 |
| 2002/0108684 A1 * | 8/2002 | Quick et al. | .......... | 148/527 |
| 2004/0166596 A1 | 8/2004 | Sashida et al. | | |
| 2006/0043452 A1 * | 3/2006 | Ueda et al. | .......... | 257/310 |
| 2006/0079066 A1 * | 4/2006 | Mikawa et al. | ......... | 438/393 |
| 2006/0261478 A1 * | 11/2006 | Thei et al. | ......... | 257/751 |
| 2007/0040196 A1 * | 2/2007 | Matsuura | .......... | 257/295 |
| 2007/0099375 A1 * | 5/2007 | Kim et al. | .......... | 438/238 |
| 2007/0275484 A1 * | 11/2007 | Mitsui | .......... | 438/3 |
| 2008/0212358 A1 * | 9/2008 | Mitsui | .......... | 365/145 |

FOREIGN PATENT DOCUMENTS

JP 2005150262 A 6/2005

OTHER PUBLICATIONS

J.H. Park et al., "Fully Logic Compatible (1.6V Vcc. 2 Additional FRAM Masks) Highly Reliable Sub 10F2 Embedded FRAM with Advanced Direct Via Technology and Robust 100nm thick MOCVD PZT Technology", IEDM Technical Digest, Dec. 13-15, 2004, pp. 591-594, IEEE International.

* cited by examiner

*Primary Examiner* — William F Kraig
(74) *Attorney, Agent, or Firm* — Westerman, Hattori, Daniels & Adrian, LLP

(57) ABSTRACT

A semiconductor device includes an insulating film provided over a semiconductor substrate, a conductive plug buried in the insulating film, an underlying conductive film which is provided on the conductive plug and on the insulating film and which has a flat upper surface, and a ferroelectric capacitor provided on the underlying conductive film. At least in a region on the conductive plug, the concentration of nitrogen in the underlying conductive film gradually decreases from the upper surface to the inside.

8 Claims, 21 Drawing Sheets

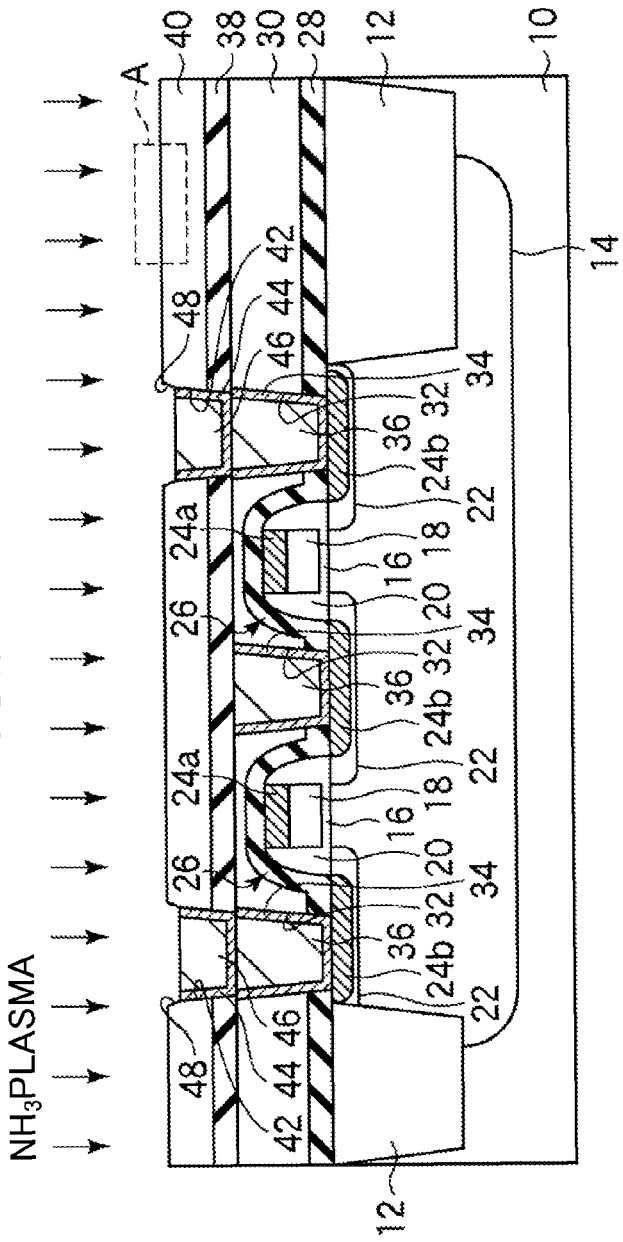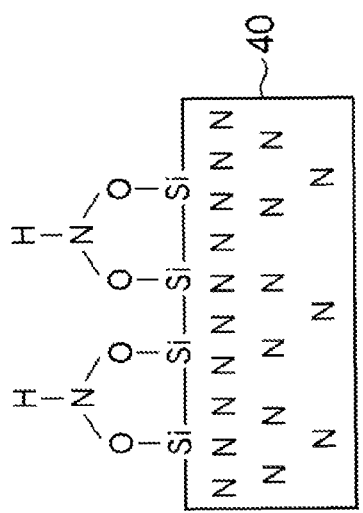

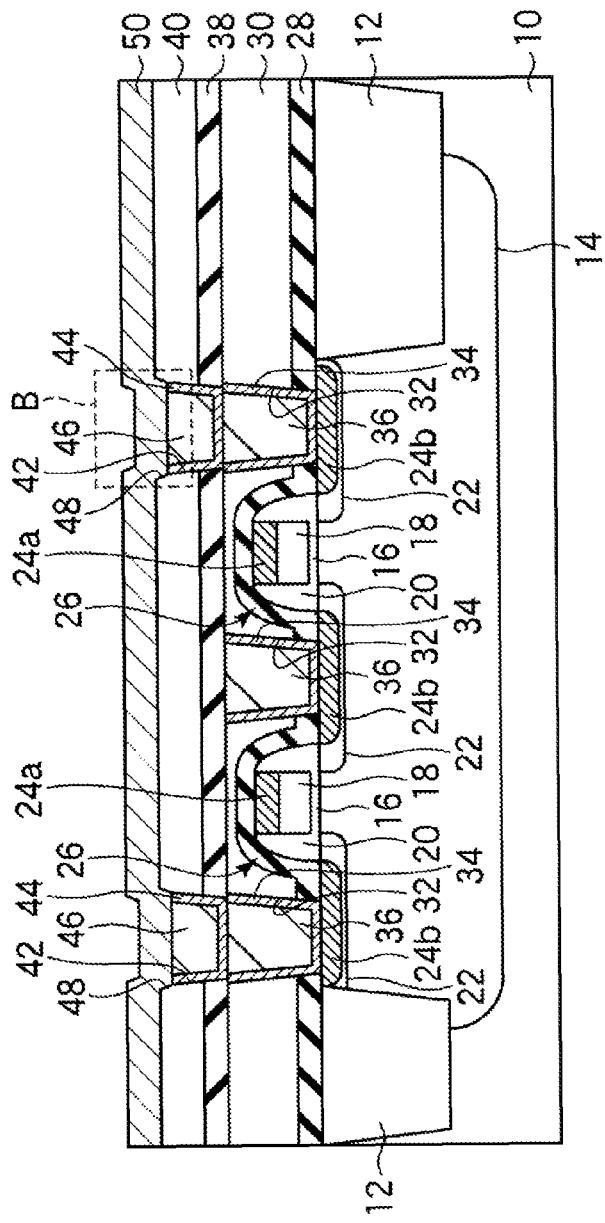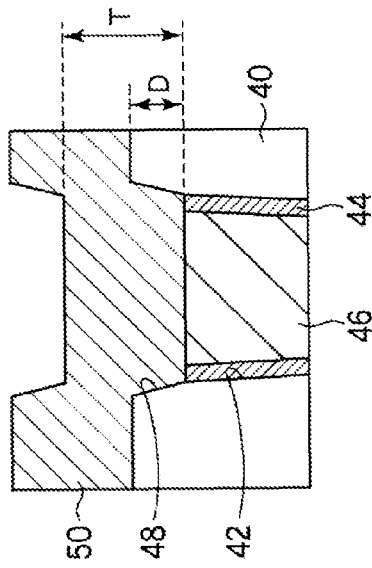

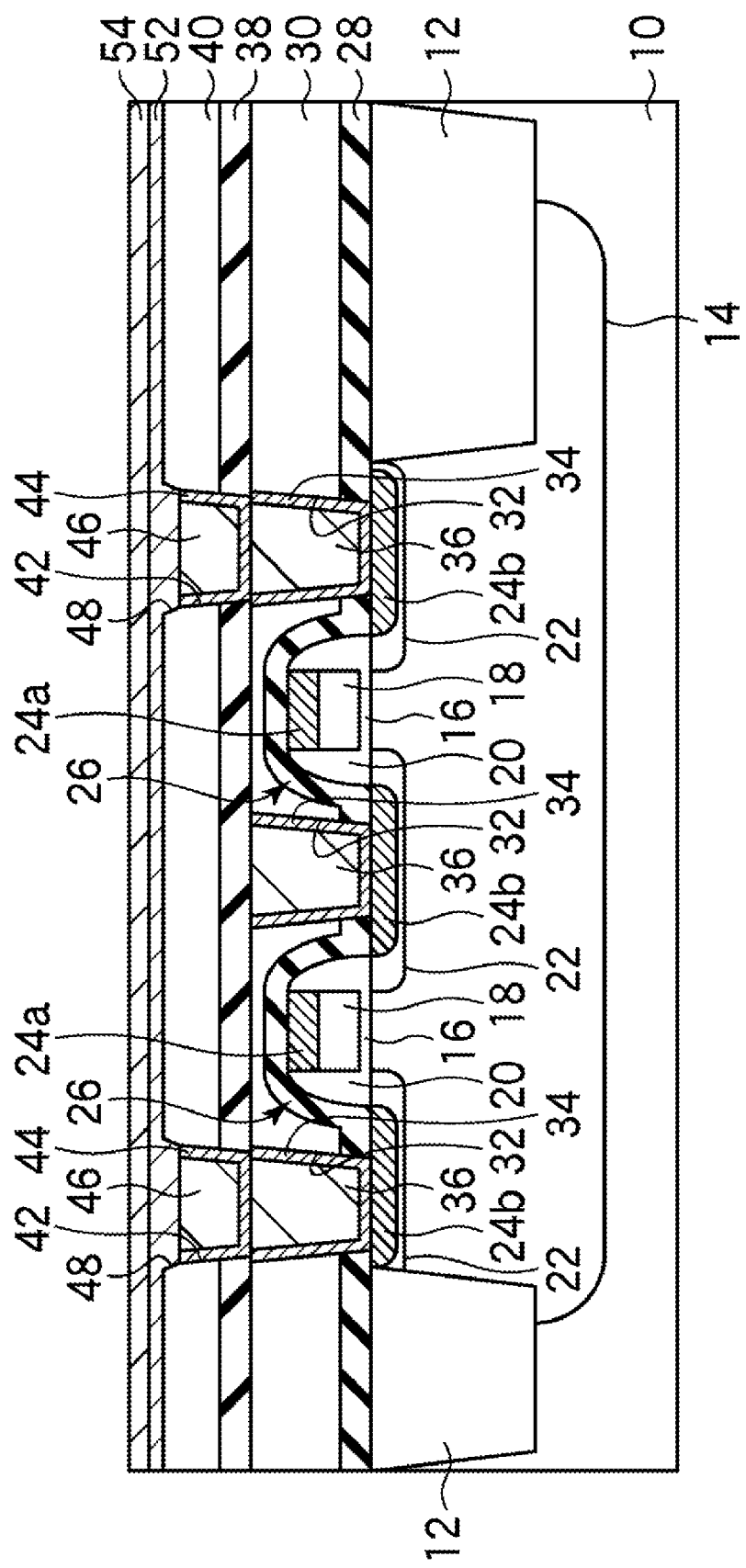

US 8,120,087 B2

FERROELECTRIC CAPACITOR WITH UNDERLYING CONDUCTIVE FILM

CROSS-REFERENCE TO RELATED APPLICATIONS

This application is based upon and claims the benefit of priority of the prior Japanese Patent Application No. 2008-172166, filed on Jul. 1, 2008 the entire contents of which are incorporated herein by reference.

FIELD

The present invention relates to a semiconductor device and a method for manufacturing the same, and more particularly relates to a semiconductor device including ferroelectric capacitors and a method for manufacturing the same.

BACKGROUND

As a non-volatile memory which may freely perform rewriting and which retains data even if the supply of electricity is stopped, a ferroelectric random access memory (Fe-RAM) has been known. Since being superior to a flash memory in terms of low-voltage operation, low power consumption, and high-speed writing, the ferroelectric random access memory is a very promising memory device.

As with other semiconductor devices, the ferroelectric random access memory described above is also required to have a higher degree of integration and a higher degree of performance.

In order to improve the degree of integration of the ferroelectric random access memory, reduction in cell area is desired. For the reduction in cell area, it has been known that a stack type cell structure is advantageous compared to a planar type cell structure. In a stack type memory cell, an oxygen barrier film, a lower electrode, a ferroelectric film, and an upper electrode are sequentially formed over a conductive plug connected to a diffusion layer of a transistor to form a ferroelectric capacitor. The oxygen barrier layer functions to prevent oxidation of the conductive plug. In general, a conductive film functioning as both the oxygen barrier layer and the lower electrode is formed, and a laminate film including a titanium nitride film, an iridium film, and an iridium oxide film sequentially laminated to each other has been known to be used for such a conductive film.

In addition, in order to improve the degree of performance of the ferroelectric random access memory, improved electric properties of a ferroelectric capacitor are desired. In order to improve the electric properties of the ferroelectric capacitor, it is desirable to improve the crystalline orientation of its ferroelectric film. The crystalline orientation of the ferroelectric film is influenced by the film quality and the flatness of an underlayer provided under the ferroelectric film.

In order to improve the properties of the ferroelectric film, as a technique to improve the film quality of a lower electrode, a technique has been proposed in which a conductive film composed of a material having self-orientation properties, such as titanium, is formed on a conductive plug and on an interlayer insulating film so as to be used as an underlayer for the lower electrode.

In addition, as a technique to improve the flatness where a conductive plug is formed, a technique has been proposed in which a tungsten plug buried in an interlayer insulating film is etched back, and a recess portion formed by this etching back is filled with titanium nitride for planarization.

However, since titanium nitride has a higher electrical resistance than that of titanium, when the recess portion over the plug is filled with titanium nitride, the electrical resistance increases, and as a result, the electrical properties of a ferroelectric capacitor are degraded.

SUMMARY

According to one aspect of the invention, a semiconductor device includes an insulating film provided over a semiconductor substrate, a conductive plug buried in the insulating film, an underlying conductive film which is provided on the conductive plug and on the insulating film and which has a flat upper surface, and a ferroelectric capacitor provided on the underlying conductive film. At least in a region on the conductive plug, the concentration of nitrogen in the underlying conductive film gradually decreases from the upper surface to the inside.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIGS. 2 to 33 are cross-sectional views of processes conducted in a method for manufacturing the semiconductor device according to an embodiment of the present invention.

DESCRIPTION OF EMBODIMENTS

Embodiment

Figure 1:
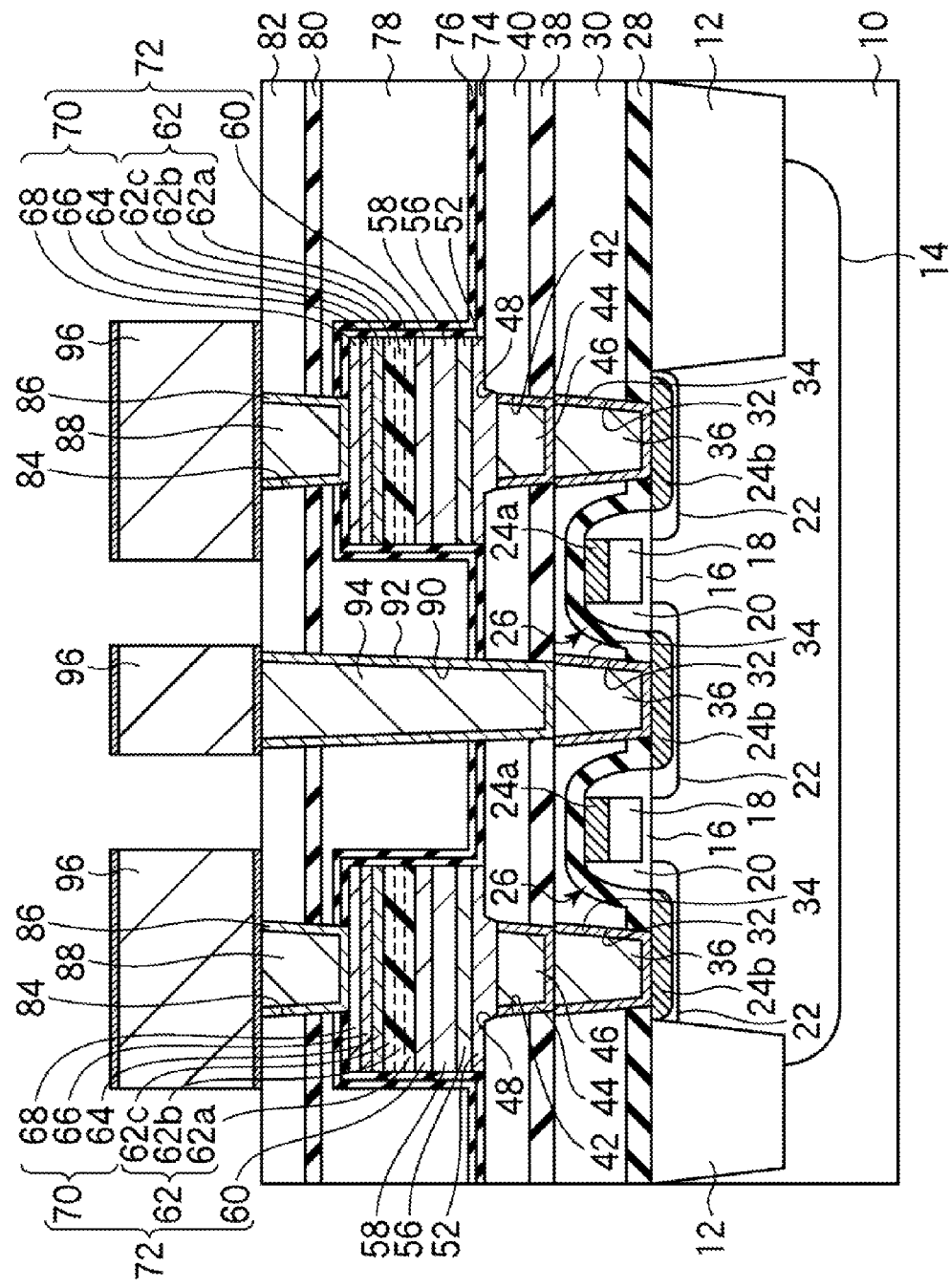
FIG. 1 is a cross-sectional view of a semiconductor device according to an embodiment of the present invention.

A semiconductor device and a method for manufacturing the semiconductor device according to an embodiment will be described with reference to FIGS. 1 to 33. FIG. 1 is a cross-sectional view of the structure of the semiconductor device according to this embodiment. FIGS. 2 to 33 are cross-sectional views of processes conducted in a method for manufacturing the semiconductor device according to this embodiment.

—Semiconductor Device—

First, the semiconductor device according to this embodiment will be described with reference to FIG. 1.

As illustrated in FIG. 1, an element isolation region 12 which defines an element region is formed in a semiconductor substrate 10. The semiconductor substrate 10 may be, for example, an n-type or a p-type silicon substrate. In the semiconductor substrate 10 in which the element isolation region 12 is formed, a p-type well 14 is formed.

Gate electrodes (gate wires) 18 are formed on the semiconductor substrate 10 in which the well 14 is formed, and gate insulating films 16 are interposed between the gate electrodes 18 and the semiconductor substrate 10. Sidewall insulating films 20 are formed on two sidewall portions of each gate electrode 18.

In the semiconductor substrate 10, a source and a drain diffusion layer 22 are formed at the two sides of each gate electrode 18 which is provided with the sidewall insulating films 20.

A silicide layer 24a is formed on the gate electrode 18, and silicide layers 24b are formed on the source and drain diffusion layers 22. The silicide layers 24b on the source and drain diffusion layers 22 function as source electrode and drain electrodes.

Accordingly, transistors 26 having the gate electrode 18 and the source and drain diffusion layers 22 are formed on the semiconductor substrate 10.

A cover insulating film 28 is formed on the semiconductor substrate 10 on which the transistors 26 are formed. The cover insulating film 28 may be, for example, an SiON film having a thickness of 200 nm.

An interlayer insulating film 30 is formed on the semiconductor substrate 10 on which the cover insulating film 28 is formed. The interlayer insulating film 30 may be, for example, a silicon oxide film having a thickness of 700 nm. The surface of the interlayer insulating film 30 is planarized.

Contact holes 32 reaching the source and drain electrodes 24b are formed in the interlayer insulating film 30 and the cover insulating film 28.

In each contact hole 32, a titanium (Ti) film having a thickness of, for example, 30 nm is formed. In the contact hole 32 in which the Ti film is formed a titanium nitride (TiN) film having a thickness of, for example, 20 nm is formed. As a result, in the contact hole 32, an adhesion layer 34 composed of a laminate film including the Ti film and the TiN film is formed.

Conductive plugs 36 are buried in the contact holes 32 in each of which the adhesion layer 34 is formed. Tungsten is used as a material for the conductive plugs 36. The conductive plugs 36 are electrically connected to the source and drain electrodes 24b.

In this embodiment, although the case in which tungsten is used as a material for the conductive plug 36 is described by way of example, the material for the conductive plug 36 is not limited to tungsten. However, in a process for manufacturing a ferroelectric memory, since a high-temperature heat treatment is performed, a high melting point metal, such as tungsten or titanium, is preferably used as the material for the conductive plug 36.

An oxidation-preventing film 38 is formed on the interlayer insulating film 30 in which the conductive plugs 36 are buried. The oxidation-preventing film 38 may be, for example, an SiON film having a thickness of 100 nm. The oxidation-preventing film 38 reduces if not prevents the conductive plugs 36 from being oxidized after the conductive plugs 36 are buried in the interlayer insulating film 30.

In this embodiment, although an SiON film is used as the oxidation-preventing film 38 is described by way of example, the oxidation-preventing film 38 is not limited to an SiON film. As the oxidation-preventing film 38, for example, a silicon nitride film may also be used.

An interlayer insulating film 40 is formed on the oxidation-preventing film 38. The interlayer insulating film 40 may be, for example, a silicon oxide film having a thickness of 200 nm. The upper surface of the interlayer insulating film 40 is planarized.

As described below, the upper surface of the interlayer insulating film 40 is processed using $NH_3$ plasma, and nitrogen is diffused therein. Nitrogen diffused in the interlayer insulating film 40 is used to nitride a Ti film 50, which is a first high melting point metal film, from the lower surface thereof to form a first underlying conductive film 52 which will be described later. After this Ti film 50 is nitrided, nitrogen still remains in the interlayer insulating film 40. A nitrogen concentration in the interlayer insulating film 40 gradually decreases from the upper surface to the inside.

Contact holes 42 reaching the conductive plugs 36 are formed in the interlayer insulating film 40 and the oxidation-preventing film 38.

In each contact hole 42, a Ti film having a thickness of, for example, 30 nm is formed. In the contact hole 42 in which the Ti film is formed, a TiN film having a thickness of, for example, 20 nm is formed. As a result, in the contact hole 42, an adhesion layer 44 is formed from a laminate film including the Ti film and the TiN film.

Conductive plugs 46 are buried in the contact holes 42 in each of which the adhesion layer 44 is formed. As a material for the conductive plug 46, tungsten may be used. The conductive plug 46 is electrically connected to the conductive plug 36.

In this embodiment, although tungsten is used as a material for the conductive plug 46 by way of example, the material for the conductive plug 46 is not limited to tungsten. However, since a high-temperature heat treatment is performed in a process for manufacturing a ferroelectric memory, a high melting point metal, such as tungsten or titanium, is preferably used as the material for the conductive plug 46.

The height of the upper surface of the conductive plug 46 is lower than the height of the upper surface of the interlayer insulating film 40, and a recess portion 48 is formed where the conductive plug 46 is buried. When the conductive plug 46 is buried in the interlayer insulating film 40 by a chemical mechanical polishing (CMP) method, upper portions of the adhesion layer 44 and the conductive plug 46 in the contact hole 42 may be excessively polished. In addition, in the conductive plug 46, voids may be formed. The recess portion 48 is formed by the excessive polishing of the conductive plug 46 and the like by a CMP method as described above and/or by the influence of the voids formed in the conductive plug 46.

The first underlying conductive film 52 having a flat upper surface is formed on the conductive plug 46 and the interlayer insulating film 40 so as to fill the recess portion 48. The first underlying conductive film 52 is a Ti film in which an upper layer portion and a lower layer portion are nitrided. The upper surface of the first underlying conductive film 52 is planarized by a CMP method. The first underlying conductive film 52 is electrically connected to the conductive plug 46

In the first underlying conductive film 52, the upper layer portion in a region on the interlayer insulating film 40 and in a region on the conductive plug 46 is nitrided, and the lower layer portion in the region on the interlayer insulating film 40 is nitrided. However, the lower layer portion of the first underlying conductive film 52 in the region on the conductive plug 46 is not nitrided.

As described later, the first underlying conductive film 52 is formed in such a way that the Ti film 50 having the upper surface planarized by a CMP method is processed by a heat treatment in a nitrogen ($N_2$) gas atmosphere to be nitrided from the upper surface and to be nitrided from the lower surface by nitrogen contained in the interlayer insulating film 40. Hence, the nitrogen in the interlayer insulating film 40 has a concentration gradient as described below.

A nitrogen concentration in the first underlying conductive film 52 in the region on the interlayer insulating film 40 and in the region on the conductive plug 46 gradually decreases from the upper surface to the inside. Furthermore, a nitrogen concentration in the first underlying conductive film 52 in the region on the interlayer insulating film 40 gradually decreases from the lower surface to the inside.

On the other hand, since the first underlying conductive film 52 in the region on the conductive plug 46 is not provided with the interlayer insulating film 40 therebetween, no nitridation occurs from the lower surface. Hence, a nitrogen concentration at the interface between the first underlying conductive film 52 and the conductive plug 46 is lower than that at the interface between the first underlying conductive film 52 and the interlayer insulating film 40. As a result, a nitrogen concentration in the first underlying conductive film 52 in the region on the conductive plug 46 is lower than that in the first underlying conductive film 52 in the region on the interlayer insulating film 40. Since the nitrogen concentration in the first underlying conductive film 52 in the region on the conductive plug 46 is low, a good electrical connection between the conductive plug 46 and the first underlying conductive film 52 may be realized.

As described above, in the first underlying conductive film 52, the upper layer portion thereof in the region on the interlayer insulating film 40 and in the region on the conductive plug 46 is nitrided, and the lower layer portion in the region on the interlayer insulating film 40 is nitrided, so that compared to a nitrogen concentration in the upper layer portion and that in the lower layer portion, a nitrogen concentration inside the first underlying conductive film 52 is low. Hence, the electrical resistance of the first underlying conductive film 52 may be suppressed to a level lower than that of a TiN film formed by a sputtering method, a CVD method, or the like.

If desired, as a second high melting point metal film, a second underlying conductive film 56 is formed on the first underlying conductive film 52. The second underlying conductive film 56 is a Ti film in which an upper layer portion is nitrided. Since the second underlying conductive film 56 is formed on the flat first underlying conductive film 52, the upper surface of the second underlying conductive film 56 is also flat.

If desired, the upper layer portion of the second underlying conductive film 56 in the region above the interlayer insulating film 40 and in the region above the conductive plug 46 is nitrided.

As described below, the second underlying conductive film 56 is formed in such a way that a Ti film 54 is heat-treated in an $N_2$ atmosphere so as to be nitrided from the upper surface. Hence, nitrogen in the second underlying conductive film 56 exhibits a nitrogen concentration that gradually decreases from the upper surface to the inside.

As described above, the upper layer portion of the second underlying conductive film 56 in the region above the interlayer insulating film 40 and in the region above the conductive plug 46 is nitrided, and hence the nitrogen concentration inside is lower than that of the nitrided upper layer portion. Accordingly, the electrical resistance of the second underlying conductive film 56 is lower than the electrical resistance of a TiN film formed by a sputtering method, a CVD method, or the like.

A conductive oxygen barrier film (oxygen diffusion-preventing film) 58 is formed on the second underlying conductive film 56. The oxygen barrier film 58 may be, for example, a TiAlN film having a thickness of 100 nm. The oxygen barrier film 58 is a film to prevent oxidation of the upper surface of the conductive plug 46 after it is buried in the interlayer insulating film 40. Since the oxygen barrier film 58 is provided on the flat second underlying conductive film 56, the oxygen barrier film 58 with a desirable crystalline orientation is formed. In addition, the upper surface of the oxygen barrier film 58 is formed flat.

In this embodiment, although the case in which a TiAlN film is used as the oxygen barrier film 58 is described by way of example, the oxygen barrier film 58 is not limited to a TiAlN film. As the oxygen barrier film 58, for example, an $SrRuO_3$ film may also be used.

A lower electrode 60 is formed on the oxygen barrier film 58. The lower electrode 60 may be, for example, an iridium (Ir) film having a thickness of 60 to 100 nm. Since being provided on the flat oxygen barrier film 58, the lower electrode 60 with a desirable crystalline orientation is formed. In addition, the upper surface of the lower electrode 60 is formed flat.

In this embodiment, although the case in which an Ir film is used as the lower electrode 60 is described by way of example, the lower electrode 60 is not limited to an Ir film. As the lower electrode 60, for example, a Pt film may also be used.

A ferroelectric film 62 is formed on the lower electrode 60. The ferroelectric film 62 is a $PbZr_xTi_{1-x}O_3$ film (PZT film). The ferroelectric film 62 includes an initial layer 62a and a core layer 62b, which are formed by an MOCVD method or the like, and a surface layer portion 62c formed by a sputtering method. The total thickness of the initial layer 62a and the core layer 62b may be, for example, 100 nm, and the thickness of the surface layer portion 62c may be, for example, 10 nm. Since being provided on the flat lower electrode 60, the ferroelectric film 62 has a desirable crystalline orientation. In addition, the upper surface of the ferroelectric film 62 is flat.

An upper electrode 70 is formed on the ferroelectric film 62. The upper electrode 70 is formed by sequentially laminating a first conductive film 64 composed of, for example, an iridium oxide ($IrO_x$) film having a thickness of 25 nm, a second conductive film 66 composed of, for example, an iridium oxide ($IrO_y$) film having a thickness of 50 to 150 nm, and a third conductive film 68 composed of, for example, an Ir film having a thickness of 50 to 100 nm. Since being provided on the flat ferroelectric film 62, the first to the third conductive films 64, 66, and 68 each have a desirable crystalline orientation. The oxygen composition ratio X of the first conductive film 64, which is the $IrO_x$ film, is lower than the oxygen composition ratio Y of the second conductive film 66, which is the $IrO_y$ film. The third conductive film 68, the Ir film, functions as a hydrogen barrier film (hydrogen diffusion-preventing film) to prevent the ferroelectric film 62 from being reduced by hydrogen. In addition, the third conductive film 68, which is the Ir film, also functions as a conductivity improving film to ensure a desirable electrical connection between the upper electrode 70 and a conductive plug 88 which will be described later.

In this embodiment, although the case in which a laminate film including the first to the third conductive films 64, 66, and 68 is used as the upper electrode 70 is described by way of example, the upper electrode 70 is not limited to the above laminate film. As the upper electrode 70, a Pt film, a TiAlN film, an $SrRuO_3$ film, or the like may also be used.

As a result, a ferroelectric capacitor 72 having the lower electrode 60, the ferroelectric film 62, and the upper electrode 70 is formed above the conductive plug 46 and the interlayer insulating film 40 with the first underlying conductive film 52, the second underlying conductive film 56, and the oxygen barrier film 58 interposed therebetween.

On the interlayer insulating film 40 above which the ferroelectric capacitor 72 is formed, a hydrogen barrier film 74 (hydrogen diffusion-preventing film) is formed so as to cover the ferroelectric capacitor 72. The hydrogen barrier film 74 may be, for example, an aluminum oxide ($Al_2O_3$) film having a thickness of 2 to 5 nm. The hydrogen barrier film 74 reduces if not prevents the ferroelectric film 62 from being reduced by hydrogen.

A hydrogen barrier film (hydrogen diffusion-preventing film) 76 is also formed on the hydrogen barrier film 74. The hydrogen barrier film 76 may be, for example, an aluminum oxide film having a thickness of 38 nm. The hydrogen barrier film 76 reduces if not prevents the ferroelectric film 62 from being reduced by hydrogen in cooperation with the hydrogen barrier film 74.

An interlayer insulating film 78 is formed on the hydrogen barrier film 76. The interlayer insulating film 78 may be, for example, a silicon oxide film having a thickness of 800 nm. The upper surface of the interlayer insulating film 78 is planarized.

A hydrogen barrier film (hydrogen diffusion-preventing film) 80 is formed on the interlayer insulating film 78. The hydrogen barrier film 80 is, for example, an aluminum oxide film having a thickness of 20 to 100 nm. The hydrogen barrier film 80 is a film functioning to prevent the ferroelectric film 62 from being reduced by hydrogen along with the hydrogen barrier films 74 and 76 which are also each formed of an aluminum oxide film. Since being provided on the planarized interlayer insulating film 78, the hydrogen barrier film 80 is flat.

An interlayer insulating film 82 is formed on the hydrogen barrier film 80. The interlayer insulating film 82 may be, for example, a silicon oxide film having a thickness of 250 nm. The upper surface of the interlayer insulating film 82 is planarized.

A contact hole 84 reaching the upper electrode 70 is formed in the interlayer insulating film 82, the hydrogen barrier film 80, the interlayer insulating film 78, the hydrogen barrier film 76, and the hydrogen barrier film 74.

An adhesion layer 86 is formed in the contact hole 84. The adhesion layer 86 may be, for example, a TiN film having a thickness of 125 nm. In this embodiment, although the film-formation thickness of the adhesion layer 86 is approximately 125 nm, the thickness thereof on the sidewall of the contact hole 84 is approximately 20 to 30 nm, and the thickness at the bottom thereof is approximately 80 nm. The thickness at the bottom of the contact hole 84 varies depending on the aspect ratio thereof. In addition, instead of a TiN film, the adhesion layer 86 may be formed from a laminate film of a Ti film and a TiN film.

The conductive plug 88 is buried in the contact hole 84 in which the adhesion layer 86 is formed. As a material for the conductive plug 88, for example, tungsten is used. The conductive plug 88 is electrically connected to the upper electrode 70.

A contact hole 90 reaching the conductive plug 36 is formed in the interlayer insulating film 82, the hydrogen barrier film 80, the interlayer insulating film 78, the hydrogen barrier film 76, the hydrogen barrier film 74, the interlayer insulating film 40, and the oxidation-preventing film 38.

An adhesion layer 92 is formed in the contact hole 90. The adhesion layer 92 may be, for example, a TiN film having a thickness of 125 nm. In this embodiment, although the film-formation thickness of the adhesion layer 92 is 125 nm, the thickness on the sidewall of the contact hole 90 is approximately 20 to 30 nm, and the thickness at the bottom of the contact hole 90 is approximately 50 nm. The thickness at the bottom of the contact hole 90 varies depending on the aspect ratio thereof. In addition, instead of a TiN film, the adhesion layer 92 may be formed from a laminate film of a Ti film and a TiN film.

A conductive plug 94 is buried in the contact hole 90 in which the adhesion layer 92 is formed. As a material for the conductive plug 94, for example, tungsten is used. The conductive plug 94 is electrically connected to the conductive plug 36.

Wires 96 are formed on the interlayer insulating film 82 in which the conductive plugs 88 and 94 are buried. The wires 96 are electrically connected to the conductive plugs 88 and 94. The wires 96 are formed by patterning a laminate film including, for example, a Ti film having a thickness of 60 nm, a TiN film having a thickness of 30 nm, an AlCu alloy film having a thickness of 360 nm, a Ti film having a thickness of 5 nm, and a TiN film having a thickness of 70 nm, which are sequentially laminated to each other.

A plurality of layers including at least one interlayer insulating film (not shown), at least one conductive plug (not shown), and at least one wire (not shown) may be further formed on the interlayer insulating film 82 on which the wires 96 are formed.

As a result, the semiconductor device according to this embodiment is formed.

The height of the upper surface of the conductive plug 46 buried in the interlayer insulating film 40 may be lower than that of the upper surface of the interlayer insulating film 40 due to excessive polishing of the conductive plug 46 by a CMP method and due to the influence of voids in the conductive plug 46. In this case, the recess portion 48 is formed at a place at which the conductive plug 46 is buried. In addition, although the recess portion 48 is not formed over the whole conductive plug 46, voids in the conductive plug 46 may be exposed at the upper surface thereof in some cases so as to form small recess portions in the upper surface of the conductive plug 46.

When the oxygen barrier film 58 and the lower electrode 60 are formed above the conductive plug 46 and the interlayer insulating film 40 in the state in which the recess portion 48 is generated where the conductive plug 46 is buried or in which voids are exposed at the upper surface of the conductive plug 46, at least one recess portion is formed in the upper surface of the lower electrode 60. It is difficult to form the ferroelectric film 62 with a desirable crystalline orientation on the lower electrode 60 in which the recess portion as described above is formed.

On the other hand, in the semiconductor device according to this embodiment, the recess portion 48 generated where the conductive plug 46 is buried is filled with the first underlying conductive film 52, and the oxygen barrier film 58 and the lower electrode 60 are sequentially formed above the first underlying conductive film 52. In addition, the upper surface of the first underlying conductive film 52 is formed flat. Hence, in this embodiment, the oxygen barrier film 58 and the lower electrode 60 may both be formed flat, so that the crystalline orientation thereof may be suitably made. Since being provided on the flat lower electrode 60 having a desirable crystalline orientation, the ferroelectric film 62 may be formed so as to have desirable crystalline orientation, according to this embodiment. Hence, in this embodiment, a semiconductor device may be provided which includes the ferroelectric capacitors 72 each formed to have desirable electrical properties and high reliability.

In addition, according to this embodiment, the second underlying conductive film 56 is formed on the first underlying conductive film 52, and the oxygen barrier film 58 and the lower electrode 60 are sequentially formed on this second underlying conductive film 56. Accordingly, in this embodiment, the oxygen barrier film 58 and the lower electrode 60 may be each reliably formed to have a flat surface, and hence the ferroelectric film 62 may be reliably formed to have a desirable crystalline orientation.

Furthermore, in this embodiment, since the upper layer portion of the first underlying conductive film 52 in the region on the conductive plug 46 is nitrided, the nitrogen concentration inside is lower than that at the upper layer portion. Hence, the electrical resistance of the first underlying conductive film 52 may be lowered, and hence a desirable electrical connection between the lower electrode 60 of the ferroelectric capacitor 72 and the conductive plug 46 may be achieved.

In addition, when the second underlying conductive film 56 is formed, the upper layer portion of the first underlying conductive film 52 in the region on the interlayer insulating film 40 and in the region on the conductive plug 46 is nitrided, and the lower layer portion of the first underlying conductive film 52 in the region on the interlayer insulating film 40 is nitrided, so that the nitrogen concentration inside is lower than the nitrogen concentrations in the nitrided upper and lower layer portions. In addition, the upper layer portion of the second underlying conductive film 56 in the region above the interlayer insulating film 40 and in the region above the conductive plug 46 is nitrided, and hence the nitrogen concentration inside is lower than that in the nitrided upper layer portion. Accordingly, the electrical resistance of the first underlying conductive film 52 and that of the second underlying conductive film 56 may be lowered, and hence a desirable electrical connection between the lower electrode 60 of the ferroelectric capacitor 72 and the conductive plug 46 may be achieved.

—Method for Manufacturing Semiconductor Device—

Next, a method for manufacturing a semiconductor device according to this embodiment will be described with reference to FIGS. 2 to 33.

First, the element isolation region 12 is formed in the semiconductor substrate 10, for example, by a shallow trench isolation (STI) method. As the semiconductor substrate 10, for example, an n-type or a p-type silicon substrate is used. By the element isolation region 12, an element region in which the transistors 26 are formed is defined. In addition, the method for forming the element isolation region 12 is not limited to an STI method. For example, the element isolation region 12 may be formed using a local oxidation of silicon (LOCOS) method.

Next, by an ion implantation method, a p-type dopant is implanted in the semiconductor substrate 10, so that the p-type well 14 is formed.

Subsequently, by a thermal oxidation method or the like, the gate insulating films 16 having a thickness, for example, of 3.0 nm are formed on the element region.

Next, by a CVD method or the like, for example, a polycrystalline silicon film 18 having a thickness of 180 nm is formed. The polycrystalline silicon film 18 is formed into gate electrodes and the like. In addition, instead of the polycrystalline silicon film 18, an amorphous silicon film may be formed.

Subsequently, the polycrystalline silicon film 18 is patterned using a photolithographic technique. As a result, the gate electrodes (gate wires) 18 each made of a polycrystalline silicon film are formed. On the semiconductor substrate 10 in which the well 14 is formed, the two gate wires 18 are disposed with a specific distance therebetween and are used as parts of word lines.

Next, an n-type dopant is implanted in the semiconductor substrate 10 at two sides of each gate electrode 18 by an ion implantation method using the gate electrode 18 as a mask. As a result, extension regions (not shown in the figure) are formed which are used as shallow regions of extension source and drain.

After a silicon oxide film is formed, for example, by a CVD method on the entire surface, the silicon oxide film is etched back. As a result, the sidewall insulating films 20 each composed of a silicon oxide film are formed on the sidewall portions of each gate electrode 18.

Subsequently, an n-type dopant is implanted in the silicon substrate 10 at the two sides of each gate electrode 18 by an ion implantation method using each gate electrode 18 provided with the sidewall insulating films 20 as a mask. As a result, impurity diffusion layers (not shown) are formed which are used as deep regions of the extension source and drain. Accordingly, the source and drain diffusion layers 22 each having the extension region and the deep impurity diffusion layer are formed.

Next, by a sputtering method or the like, a high melting point metal layer (not shown) composed, for example, of cobalt is formed on the entire surface.

Subsequently, by performing a heat treatment, a surface layer portion of the semiconductor substrate 10 and the high melting point metal layer are allowed to react with each other, and an upper portion of each gate electrode 18 and the high melting point metal layer are also allowed to react with each other.

Next, the un-reacted high melting point metal layer is removed, for example, by wet etching.

Accordingly, the high melting point metal silicide source and drain electrodes 24b are formed on the source and drain diffusion layers 22. In addition, the high melting point metal silicide layer 24a is formed on the gate electrode 18.

Figure 2:
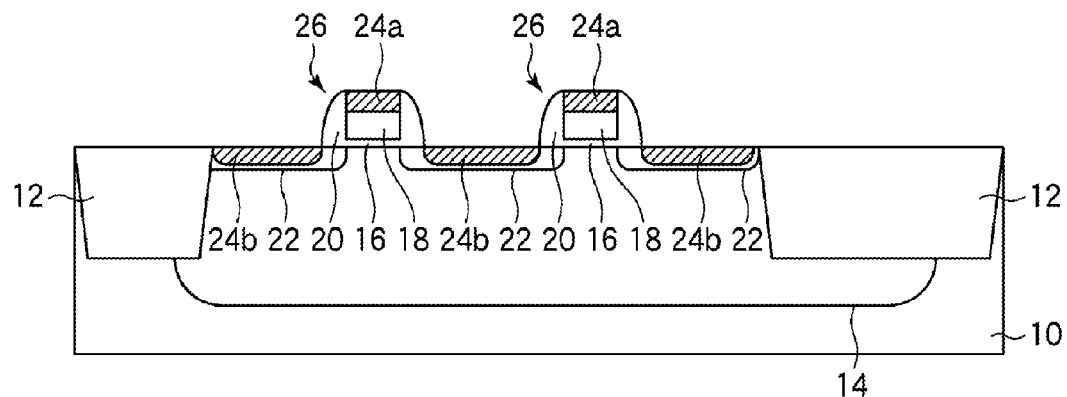
Figure 3:
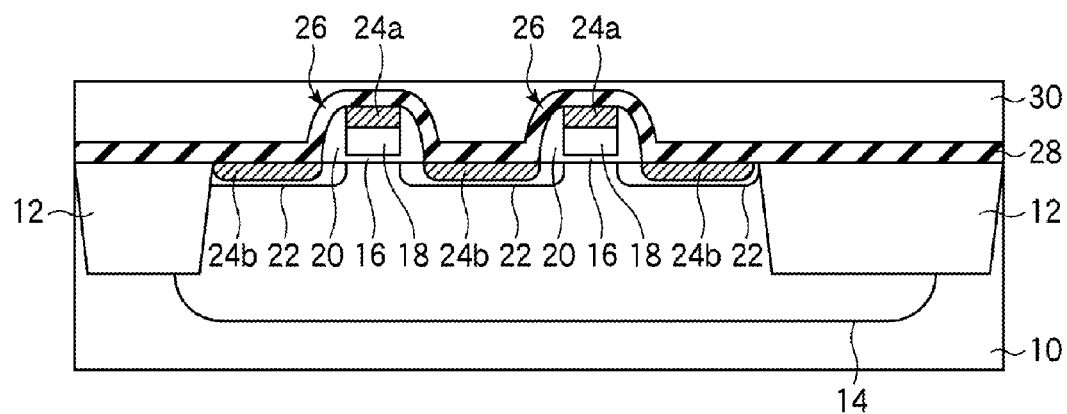

As a result, the transistors 26 each having the gate electrode 18 and the source and the drain diffusion layers 22 are formed on the semiconductor substrate 10 (see FIG. 2).

The cover insulating film 28 is then formed, for example, by a plasma CVD method on the entire surface. As the cover insulating film 28, for example, an SiON film having a thickness of 200 nm is formed.

The interlayer insulating film 30 is then formed on the entire surface, for example, by a plasma CVD method using TEOS as a source gas. As the interlayer insulating film 30, for example, a silicon oxide film having a thickness of, for example, 1,000 nm is formed.

The upper surface of the interlayer insulating film 30 is then planarized, for example, by a CMP method. As a result, the interlayer insulating film 30 having a thickness, for example, of 700 nm is formed (see FIG. 3).

Figure 4:
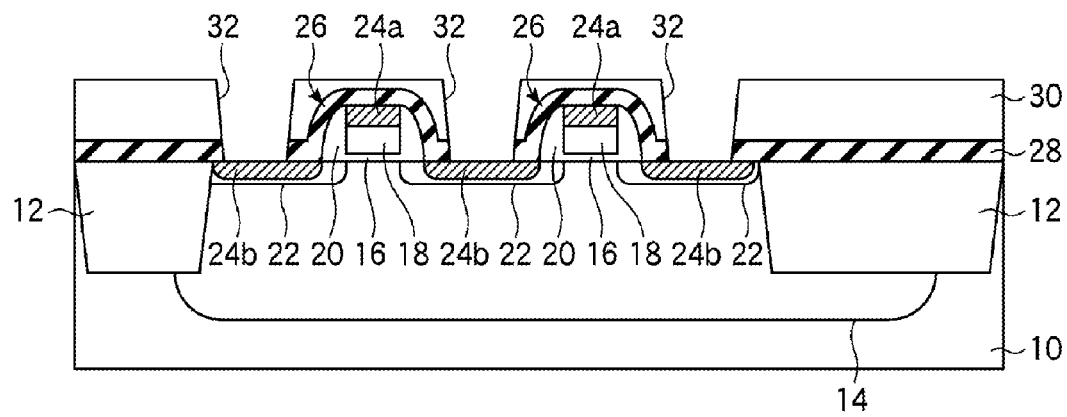
Figure 5:
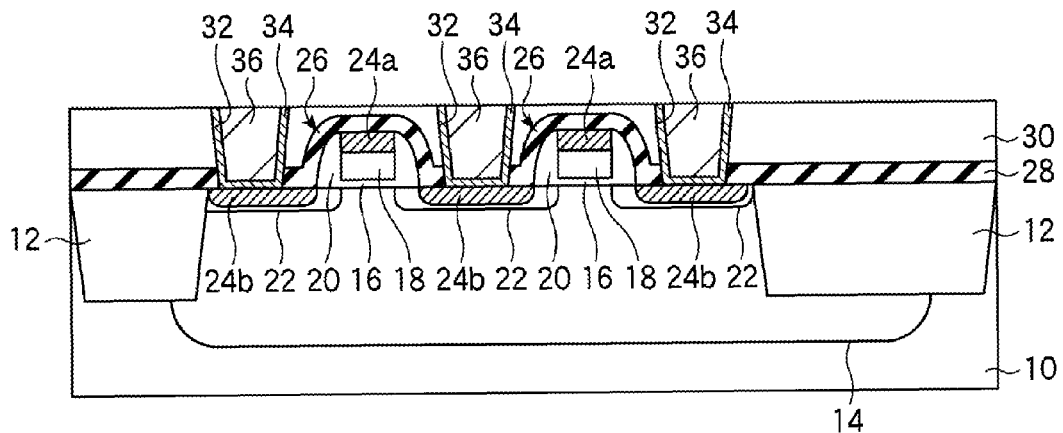

By using a photolithographic technique, the contact holes 32 reaching the source and drain electrodes 24b are then formed in the interlayer insulating film 30 and the cover insulating film 28 (see FIG. 4). The diameter of the contact hole 32 may be set, for example, to 0.25 μm.

Subsequently, by a sputtering method or the like, for example, a Ti film having a thickness of 30 nm is formed on the entire surface. Next, by a sputtering method or the like, for example, a TiN film having a thickness of, for example, 20 nm is formed on the entire surface. As a result, the adhesion layer 34 is formed from the laminate film including the Ti film and the TiN film.

Next, by a CVD method or the like, a tungsten film 36 is formed to have a thickness, for example, of 300 nm on the entire surface.

By a CMP method or the like, the tungsten film 36 and the adhesion layer 34 are then polished until the upper surface of the interlayer insulating film 30 is exposed. As a result, the conductive plug 36 made of tungsten is buried in the contact hole 32 (see FIG. 5).

Figure 6:
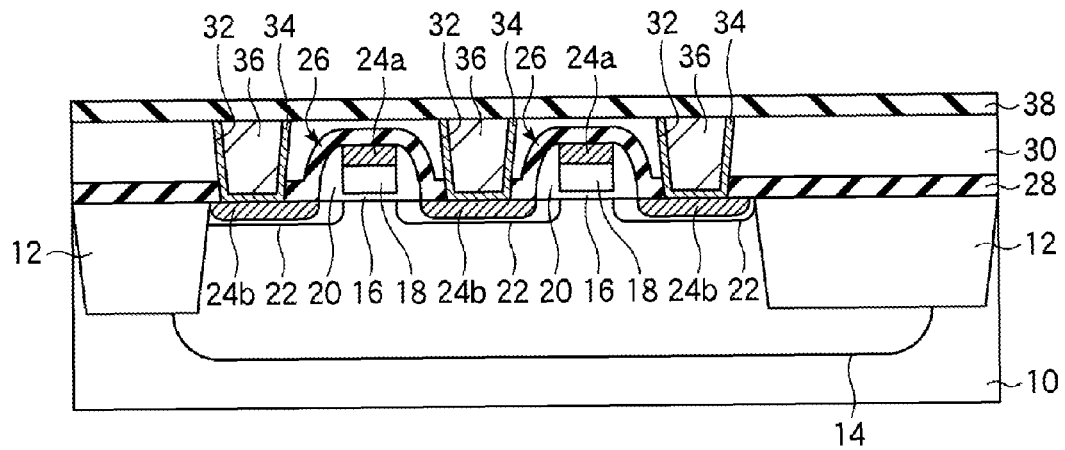

Next, by a plasma CVD method or the like, the oxidation-preventing film 38 is formed on the entire surface (see FIG. 6). As the oxidation-preventing film 38, for example, an SiON film having a thickness of 100 nm is formed. The oxidation-preventing film 38 is a film to prevent the conductive plug 36 from being oxidized after the conductive plug 36 is buried in the interlayer insulating film 30.

In this embodiment, although the case in which an SiON film is used as the oxidation-preventing film 38 is described by way of example, the oxidation-preventing film 38 is not limited to an SiON film. As the oxidation-preventing film 38, for example, a silicon nitride film may also be used. However, in terms of improvement in adhesion between the oxidation-preventing film 38 and another layer and in terms of improvement in shape of the contact hole 42 formed in the oxidation-preventing film 38, an SiON film is preferably used as the oxidation-preventing film 38.

Figure 7:
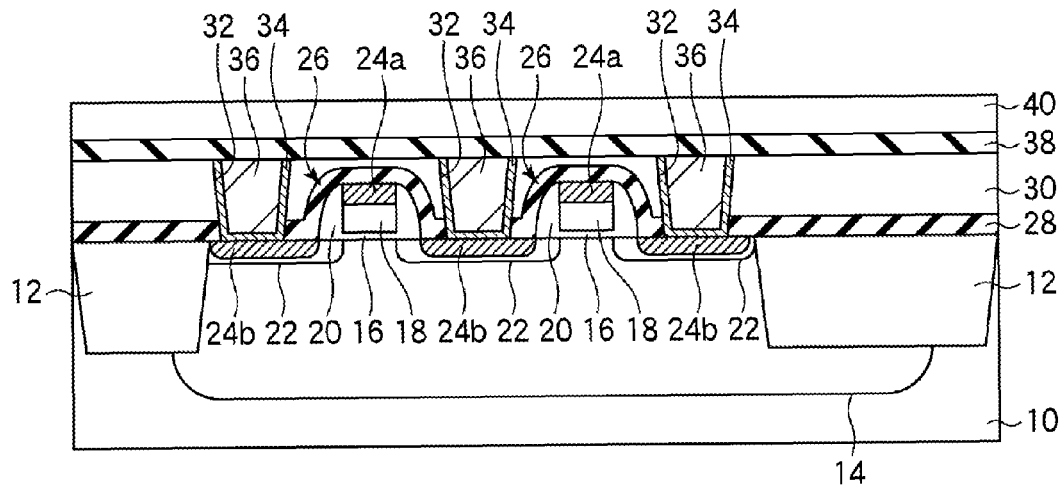

Subsequently, for example, by a plasma CVD method using TEOS as a source gas, the interlayer insulating film 40 is formed on the entire surface (see FIG. 7). As the interlayer insulating film 40, for example, a silicon oxide film having a thickness of 200 nm is formed. The reasons a silicon oxide film is formed as the interlayer insulating film 40 using TEOS as a source gas are as follows. By a plasma treatment of the upper surface of the interlayer insulating film 40 using $NH_3$ plasma, which will be described later, $NH_3$ groups may be easily bonded to oxygen atoms present on the upper surface of the interlayer insulating film 40, and in addition, nitrogen may be easily stored in the interlayer insulating film 40.

Figure 8:
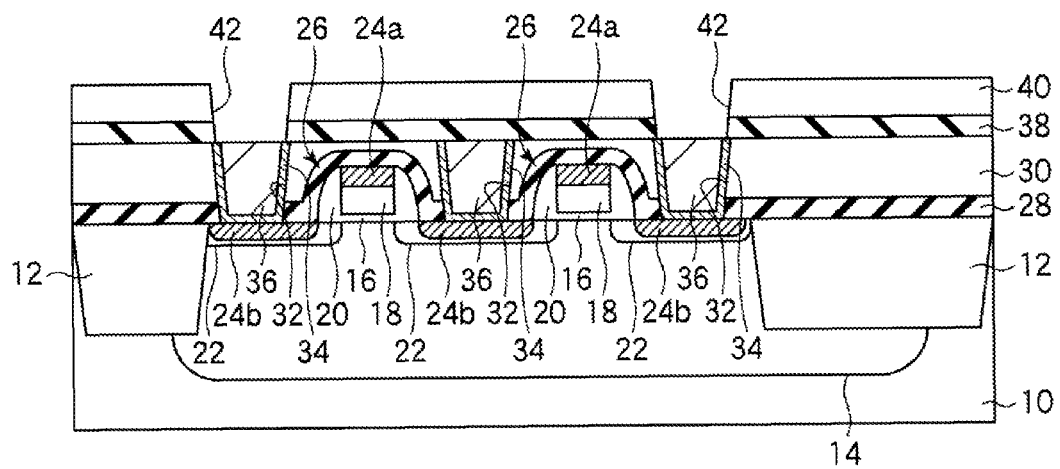

By a photolithographic technique, the contact hole 42 reaching the conductive plug 36 is formed in the interlayer insulating film 40 and the oxidation-preventing film 38 (see FIG. 8). The diameter of the contact hole 42 is set, for example, to 0.25 μm.

By a sputtering method or the like, for example, a TiN film having a thickness of 30 nm is then formed on the entire surface. Subsequently, by a sputtering method or the like, for example, a TiN film having a thickness of 20 nm is formed on the entire surface. As a result, the adhesion layer 44 is formed from the laminate film including the Ti film and the TiN film.

Next, by a CVD method or the like, for example, a tungsten film 46 having a thickness of 300 nm is formed on the entire surface.

By a CMP method, the upper portions of the tungsten film 46, the adhesion layer 44, and the interlayer insulating film 40 are then polished. In this step, in order to prevent polishing remains from being generated on the interlayer insulating film 40, the polishing amount by a CMP method is set larger than the total thickness of the tungsten film 46 and the adhesion layer 44 so as to perform over polishing. As a result, the conductive plug 46 using tungsten as a material is buried in the contact hole 42 (see FIG. 9).

Figure 9:
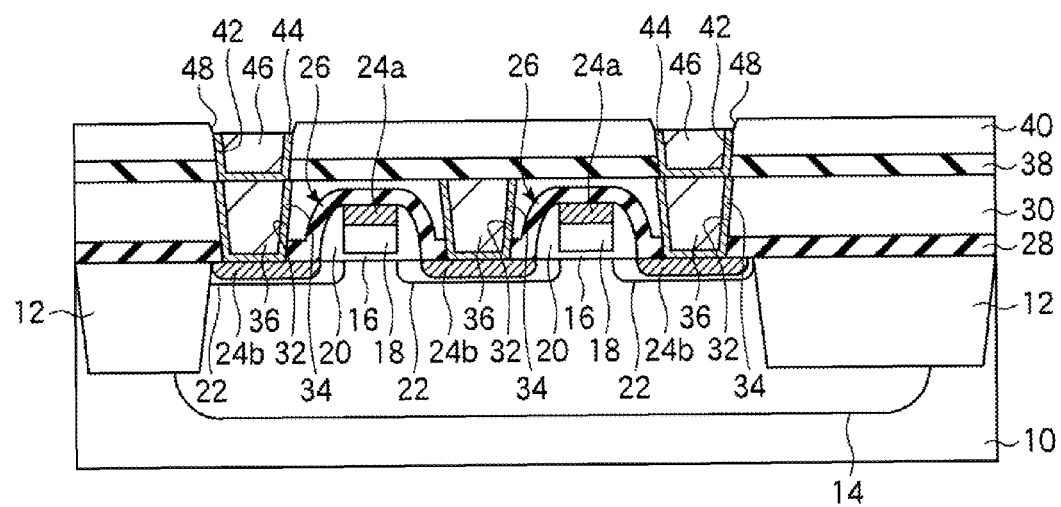

When the conductive plug 46 is buried in the interlayer insulating film 40 using a CMP method as described above, the upper portions of the adhesion layer 44 and the conductive plug 46 in the contact hole 42 may be excessively polished in some cases. As a result, as illustrated in FIG. 9, the height of the upper surface of the conductive plug 46 may be lower than the height of the upper surface of the interlayer insulating film 40, so that the recess portion 48 may be generated where the conductive plug 46 is buried.

Subsequently, the upper surface of the interlayer insulating film 40 and the upper surfaces of the conductive plugs 46 are sputtered, for example, in a plasma atmosphere (Ar plasma) generated by using an argon (Ar) gas. Accordingly, impurities on the upper surface of the interlayer insulating film 40 and the upper surfaces of the conductive plugs 46 are removed, so that those upper surfaces are cleaned. This cleaning using Ar plasma is performed to effectively carry out a plasma treatment using $NH_3$ plasma in a subsequent step on the upper surface of the interlayer insulating film 40.

In this embodiment, although the case in which the upper surface of the interlayer insulating film 40 and the upper surfaces of the conductive plugs 46 are sputtered by Ar plasma is described by way of example, the plasma is not limited to Ar plasma. For example, the upper surface of the interlayer insulating film 40 and the upper surfaces of the conductive plugs 46 may be sputtered by Ne, Kr, or Xe plasma.

Next, if desired, the upper surface of the interlayer insulating film 40 is exposed to a plasma atmosphere ($NH_3$ plasma) generated using a $NH_3$ gas, so that the upper surface of the interlayer insulating film 40 is processed by a plasma treatment (see FIG. 10A). As described above, when the upper surface of the interlayer insulating film 40 is processed by a plasma treatment using $NH_3$ plasma, $NH_3$ groups are bonded to oxygen atoms present on the upper surface of the interlayer insulating film 40, and in addition, nitrogen is diffused therein.

FIG. 10B is an enlarged cross-sectional view of a portion A surrounded by the dotted line in FIG. 10A. As illustrated in the figure, $NH_3$ groups are bonded to oxygen atoms present on the upper surface of the interlayer insulating film 40. In addition, nitrogen is diffused in the interlayer insulating film 40. The nitrogen concentration in the interlayer insulating film 40 gradually decreases from the upper surface to the inside.

The reason $NH_3$ groups are bonded to oxygen atoms present on the upper surface of the interlayer insulating film 40 is so that when the Ti film 50 is formed on the interlayer insulating film 40 in a subsequent step, Ti atoms are prevented from being trapped by oxygen atoms present on the upper surface of the interlayer insulating film 40 so as to improve the crystalline orientation of the Ti film 50. In addition, the reason nitrogen is diffused in the interlayer insulating film 40 is to nitride the Ti film 50 from the lower surface in a subsequent step.

Conditions of the plasma treatment performed on the upper surface of the interlayer insulating film 40 are set as follows. A parallel plate type plasma treatment apparatus is used as a plasma treatment apparatus. A counter electrode is placed, for example, approximately 9 mm (350 mils) apart from the semiconductor substrate 10. The pressure inside a chamber when a plasma treatment is performed is set, for example, to approximately 266 Pa (2 Torr). The substrate temperature is set, for example, to 400° C. The flow rate of a $NH_3$ gas supplied into the chamber is set, for example, to 350 sccm. A high-frequency electrical power applied to the semiconductor substrate 10 is set, for example, to 100 W at a frequency of 13.56 MHz. A high-frequency electrical power applied to the counter electrode is set, for example, to 55 W at a frequency of 350 kHz. The time for applying a high-frequency electrical power is, for example, 60 seconds.

In this embodiment, although the case in which the upper surface of the interlayer insulating film 40 is processed by a plasma treatment by exposing the upper surface thereof to a plasma atmosphere generated using a $NH_3$ gas is described by way of example, the plasma atmosphere is not limited to a plasma atmosphere generated using a $NH_3$ gas. The upper surface of the interlayer insulating film 40 may be exposed to a plasma atmosphere containing nitrogen. For example, the upper surface of the interlayer insulating film 40 may be processed by a plasma treatment by exposing the upper surface thereof to a plasma atmosphere generated using a mixed gas of a $NH_3$ gas and a $N_2$ gas. In addition, the upper surface of the interlayer insulating film 40 may be processed by a plasma treatment by exposing the upper surface thereof to a plasma atmosphere ($N_2$ plasma) generated using a $N_2$ gas. However, when $NH_3$ plasma is not included, even thought nitrogen may be diffused in the interlayer insulating film 40, it is difficult to bond NH groups to oxygen atoms present on the upper surface of the interlayer insulating film 40. Accordingly, in order to improve the crystalline orientation of the Ti film 50, the upper surface of the interlayer insulating film 40 is preferably processed by a plasma treatment using plasma including NH$_3$ plasma.

Next, the Ti film 50 having a thickness of, for example, 20 nm is formed on the conductive plugs 46 and the interlayer insulating film 40 by a sputtering method or the like (see FIG. 11A). Since the upper surface of the interlayer insulating film 40 is processed as described above, Ti atoms deposited on the interlayer insulating film 40 are not trapped by oxygen atoms and are able to freely travel on the surface of the interlayer insulating film 40. Hence, a desirable Ti film 50 that is self-oriented in the (002) orientation may be formed on the interlayer insulating film 40.

Conditions for forming the Ti film 50 are set, for example, as follows. The distance between the semiconductor substrate 10 and a target is set, for example, to 60 mm. The pressure inside a film-formation chamber is set to 0.15 Pa. As the atmosphere inside the film-formation chamber, for example, an Ar atmosphere may be used. The substrate temperature is set, for example, to 20° C. A DC power to be supplied is set, for example, to 2.6 kW. The time for supplying a DC power is set, for example, to 5 seconds. In addition, the substrate temperature at which the Ti film 50 is formed by a sputtering method is preferably set, for example, to 10 to 200° C. When the substrate temperature is set relatively low as described above, the Ti film 50 may be formed to have a desirable crystalline orientation.

FIG. 11B is an enlarged cross-sectional view of a portion B surrounded by the dotted line in FIG. 11A. As illustrated in the figure, the Ti film 50 is formed so as to have a thickness T larger than a depth D of the recess portion 48. The depth D of the recess portion 48 may be, for example, approximately 20 to 40 nm. Hence, the thickness T of the Ti film 50 is set, for example, to approximately 60 to 80 nm. As a result, the Ti film 50 is formed on the conductive plugs 46 and the interlayer insulating film 40 so as to fill the recess portions 48.

In this embodiment, although the case in which the Ti film 50 is formed by a sputtering method is described by way of example, the Ti film 50 may also be formed by a CVD method. However, by a sputtering method, the Ti film 50 may be formed to have a desirable crystalline orientation as compared to a crystalline orientation formed by a CVD method.

Subsequently, the upper surface of the Ti film 50 is polished by a CMP method so as to planarize the upper surface thereof (see FIG. 12A). The Ti film 50 is more difficult to polish compared to a TiN film. Hence, a polishing rate of the Ti film 50 may be decreased to approximately one third of that of a TiN film. Accordingly, the Ti film 50 may be stably polished with high controllability compared to a TiN film. The Ti film 50 is polished by a CMP method, for example, at a polishing pressure of 1.0 pound per square inch (psi) and at a rotation speed of 40 to 60 rpm. Based on the above conditions, the polishing rate of the Ti film 50 may be further decreased, so that the Ti film 50 may be stably polished with higher controllability.

Figure 12A:
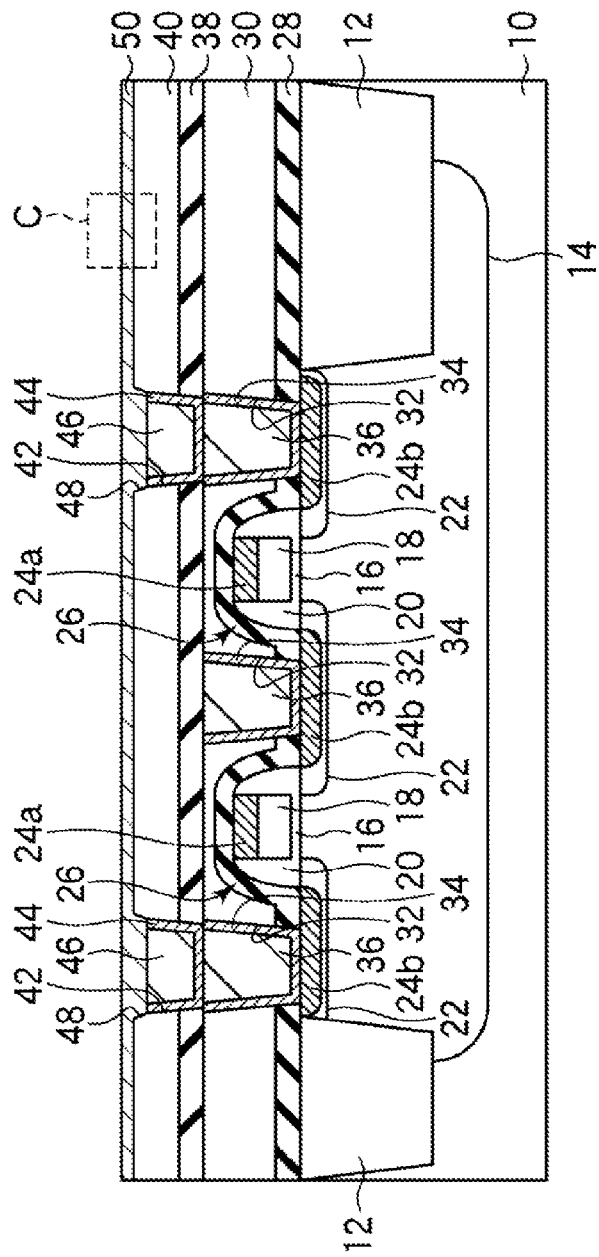
Figure 12B:
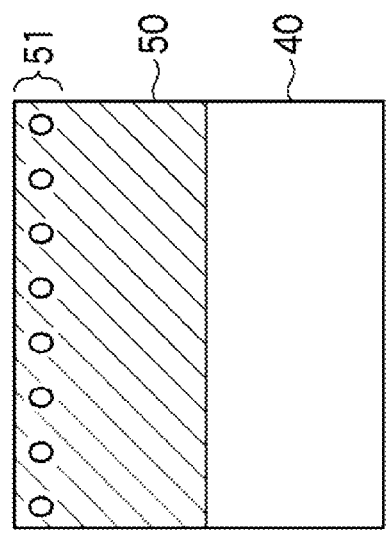

FIG. 12B is an enlarged cross-sectional view of a portion C surrounded by the dotted line in FIG. 12A. A surface layer portion of the planarized Ti film 50 is oxidized when polishing is performed by a CMP method. Hence, as illustrated in the figure, an oxide layer 51 composed of a Ti oxide is formed in the surface layer portion of the Ti film 50.

In addition, the Ti film 50 may be polished by a CMP method until the interlayer insulating film 40 is exposed so as to remove the Ti film 50 on the insulating film 40 and so as to fill the recess portions 48 with the Ti film 50.

Next, by a rapid thermal annealing (RTA) method or the like, a heat treatment is performed in an N$_2$ gas atmosphere or a mixed-gas atmosphere containing an N$_2$ gas and a noble gas. The temperature of the heat treatment is set, for example, to 650° C. The time of the heat treatment is set, for example, to 60 seconds. By this heat treatment, the Ti film 50 is nitrided from the upper surface. Furthermore, by this heat treatment, nitrogen in the interlayer insulating film 40 is diffused to the Ti film 50, and a region of the Ti film 50 on the interlayer insulating film 40 is also nitrided from the lower surface. In addition, since the heat treatment is performed by an RTA method, increases in contact resistance of the conductive plugs 36 with the source and drain diffusion layer 22 may be suppressed.

As the atmosphere in which the heat treatment is performed, any atmosphere containing an N$_2$ gas may be used. However, when the concentration of an N$_2$ gas in an atmosphere in which the heat treatment is performed is too low, the Ti film 50 may not be nitrided. Thus, the concentration of an N$_2$ gas in an atmosphere in which the heat treatment is performed is preferably set in a range of 50% to 100%. In addition, since the Ti film 50 may not be nitrided in some cases when the heat treatment temperature is too low, the heat treatment temperature is preferably set in a range of 450 to 650° C.

Figure 13A:
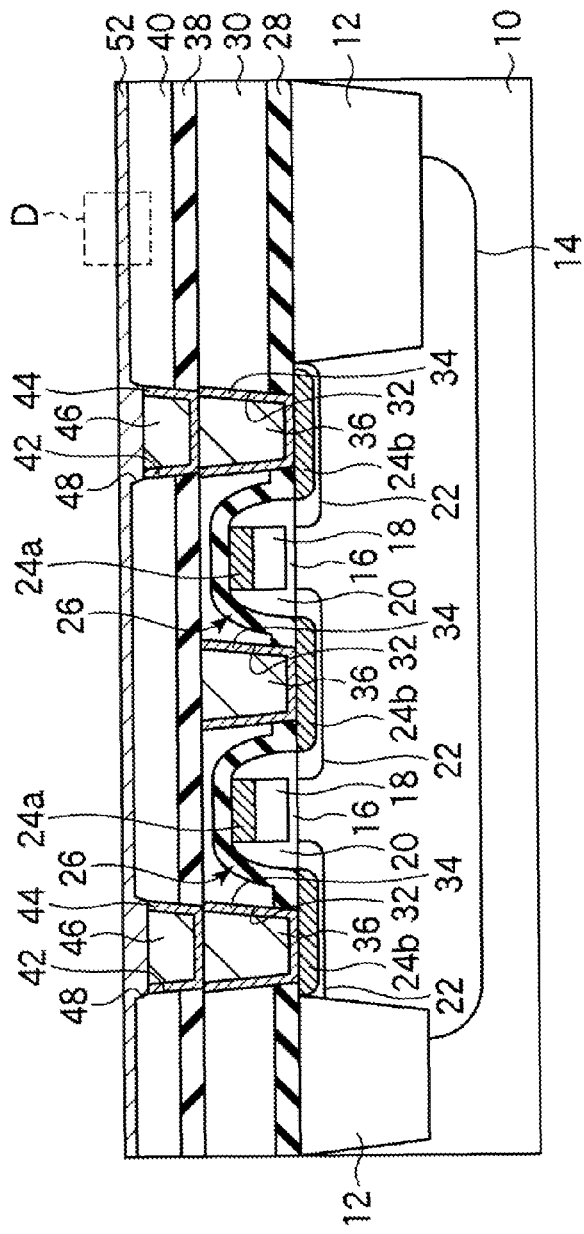

Since the Ti film 50 is nitrided as described above, the first underlying conductive film 52 composed of a (111) oriented and nitrided Ti film is obtained (see FIG. 13A). In the first underlying conductive film 52, the upper layer portion thereof in the regions on the interlayer insulating film 40 and on the conductive plugs 46 is nitrided, and the lower layer portion in the region on the interlayer insulating film 40 is nitrided.

Figure 13B:
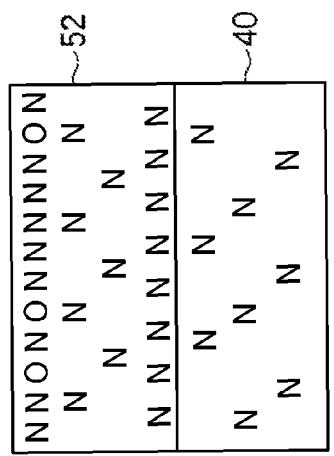

FIG. 13B is an enlarged cross-sectional view of a portion D surrounded by the dotted line in FIG. 13A. As illustrated in the figure, the nitrogen concentration in the first underlying conductive film 52 in the region on the interlayer insulating film 40 gradually decreases from the upper surface to the inside and also gradually decreases from the lower surface to the inside.

The nitrogen concentration in the first underlying conductive film 52 in the region on the conductive plug 46 also gradually decreases from the upper surface to the inside. However, since the first underlying conductive film 52 in the region on the conductive plug 46 is not provided with the interlayer insulating film 40 therebetween, the lower surface is not nitrided. Hence, the nitrogen concentration at the interface between the first underlying conductive film 52 and the conductive plug 46 is lower than that at the interface between the first underlying conductive film 52 and the interlayer insulating film 40. As a result, the nitrogen concentration in the first underlying conductive film 52 in the region on the conductive plug 46 is lower than that of the first underlying conductive film 52 in the region on the interlayer insulating film 40.

Since the Ti film 50 is nitrided from the upper surface thereof, oxygen is removed from the oxide layer 51 (see FIG. 12B). Hence, an oxygen concentration in the surface layer portion of the first underlying conductive film 52 is significantly lower than that in the surface layer portion of the Ti film 50 which is polished by a CMP method. The amount of oxygen present in the surface layer portion of the first underlying conductive film 52 is decreased.

In addition, since nitrogen in the interlayer insulating film 40 is diffused to the Ti film 50, the nitrogen concentration in the interlayer insulating film 40 is lower than that before performing the heat treatment. However, after the heat treatment, nitrogen still remains in the interlayer insulating film 40. The nitrogen concentration in the interlayer insulating film 40 after the heat treatment also gradually decreases from the upper surface to the inside.

As described above, in this embodiment, the upper layer portion of the first underlying conductive film 52 is nitrided. Hence, when performing a heat treatment in an atmosphere containing oxygen to recover electrical properties of the ferroelectric capacitor 72, the first underlying conductive film 52 may be prevented from being oxidized by oxygen diffused from above. Accordingly, the conductivity of the first underlying conductive film 52 may be preferably maintained.

In addition, when the lower layer portion of the first underlying conductive film 52 in the region on the interlayer insulating film 40 is nitrided, the adhesion between the first underlying conductive film 52 and the interlayer insulating film 40 may be improved.

Furthermore, since the first underlying conductive film 52 is nitrided, the resistance thereof against a chemical liquid used for wet etching, which is performed as a post treatment after the ferroelectric capacitor 72 is formed, is improved as compared to that of a Ti film. Hence, in the wet etching performed as a post treatment after the ferroelectric capacitor 72 is formed, the first underlying conductive film 52 is not removed by etching.

In addition, in this embodiment, since the entire first underlying conductive film 52 is not uniformly nitrided, the expansion of the first underlying conductive film 52 is suppressed compared to when the entire thereof is uniformly nitrided. In the first underlying conductive film 52 described above, strain in the crystal is reduced. Accordingly, it is possible to form a film having a desirable crystalline orientation on the first underlying conductive film 52 in which the strain in the crystal is reduced as described above.

Figure 14A:
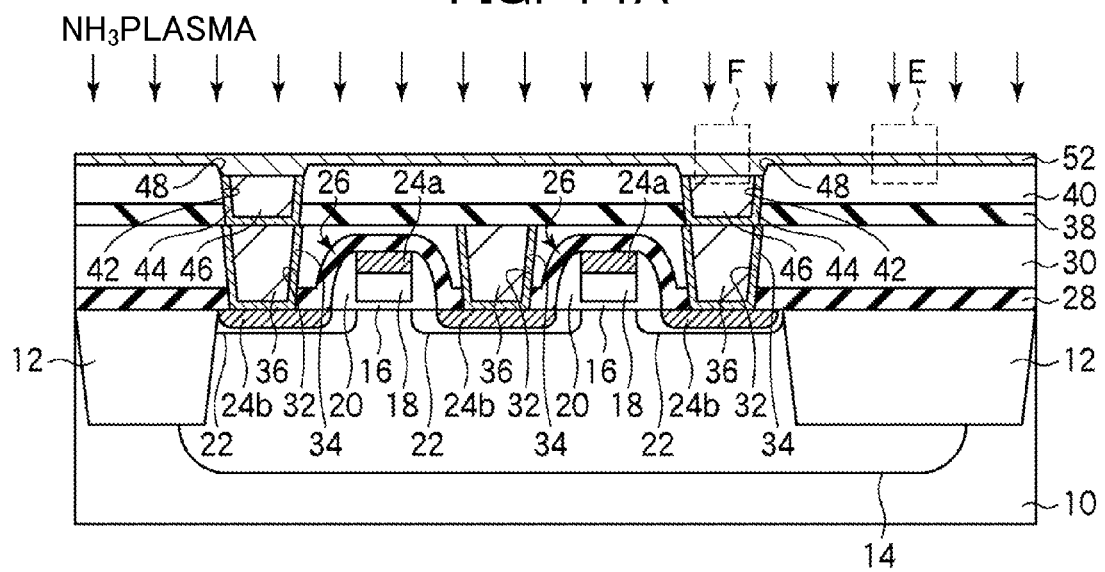

Next, if desired, the upper surface of the first underlying conductive film 52 may be processed by a plasma treatment by exposing the upper surface thereof to a plasma atmosphere generated using a $NH_3$ gas (see FIG. 14A). When the upper surface of the first underlying conductive film 52 is subjected to a plasma treatment using $NH_3$ plasma, NH bonds may generated on the upper surface of the first underlying conductive film 52.

Figure 14B:
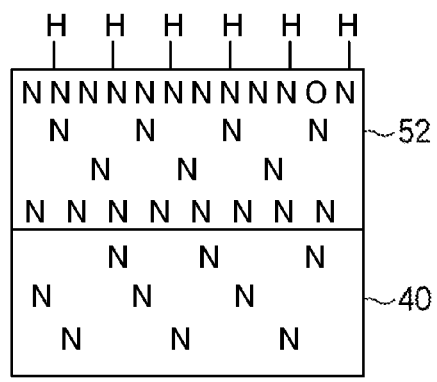
Figure 14C:
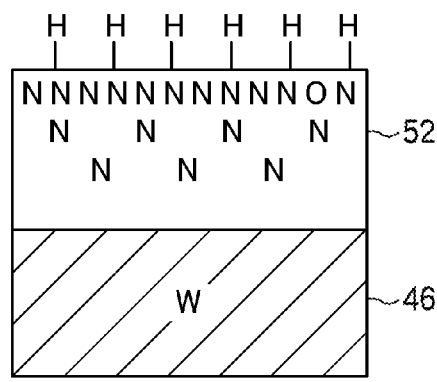

FIGS. 14B and 14C are enlarged cross-sectional views of portions E and F, respectively, surrounded by the dotted lines in FIG. 14A. As illustrated in the figures, NH bonds are generated on the upper surface of the first underlying conductive film 52 in the region on the interlayer insulating film 40 and in the region on the conductive plug 46. Accordingly, when NH bonds are generated on the upper surface of the first underlying conductive film 52 in the region on the interlayer insulating film 40 and in the region on the conductive plug 46, the Ti film 54 formed on the first underlying conductive film 52, which will be described later, may have a desirable crystalline orientation, and the crystalline orientation of the Ti film 54 in the region above the interlayer insulating film 40 is not different from that in the region above the conductive plug 46.

In addition, by the plasma treatment, oxygen is removed from the surface layer portion of the first underlying conductive film 52. Hence, the oxygen concentrations in the surface layer portion of the first underlying conductive film 52 both in the region on the interlayer insulating film 40 and in the region on the conductive plug 46 are decreased in comparison to oxygen concentrations before the plasma treatment is performed. The amount of oxygen present in the surface layer portion of the first underlying conductive film 52 is further decreased.

In addition, in this embodiment, although when the upper surface of the first underlying conductive film 52 is processed by a plasma treatment by exposing the upper surface thereof to a plasma atmosphere generated using a $NH_3$ gas, the plasma atmosphere is not limited to a plasma atmosphere generated using a $NH_3$ gas, and any atmosphere containing $NH_3$ plasma may also be used. For example, the upper surface of the first underlying conductive film 52 may be processed by a plasma treatment by exposing the upper surface thereof to a plasma atmosphere generated using a mixed gas of a $NH_3$ gas and a $N_2$ gas.

Next, by a sputtering method or the like, the Ti film 54 is formed to have, for example, a thickness of 20 nm on the first underlying conductive film 52 (see FIG. 15). Since the Ti film 54 is formed on the flat first underlying conductive film 52, the upper surface of the Ti film 54 is formed flat. In addition, since NH bonds are generated on the upper surface of the first underlying conductive film 52, the desired Ti film 54 that is self-oriented in the (002) orientation may be formed on the first underlying conductive film 52.

Conditions for forming the Ti film 54 are set, for example, as follows. The distance between the semiconductor substrate 10 and a target is set, for example, to 60 mm. The pressure inside a film-formation chamber is set to, for example, 0.15 Pa. As the atmosphere inside the film-formation chamber, for example, an Ar atmosphere may be used. The substrate temperature is set, for example, to 20° C. A DC power to be supplied is set, for example, to 2.6 kW. The time for supplying a DC power is set, for example, to 5 seconds. In addition, the substrate temperature when the Ti film 54 is formed by a sputtering method is preferably set, for example, to 10 to 200° C. When the substrate temperature is set relatively low as described above, the Ti film 54 may be formed to have a desirable crystalline orientation.

Next, by an RTA method or the like, a heat treatment is performed in an $N_2$ atmosphere or a mixed-gas atmosphere of an $N_2$ gas and a noble gas. The temperature of the heat treatment is set, for example, to 650° C. The time of the heat treatment is set, for example, to 60 seconds. By this heat treatment, the Ti film 54 is nitrided from the upper surface. In addition, since the heat treatment is performed by an RTA method, increases in contact resistance of the conductive plugs 36 with the source diffusion layer 22 and the drain diffusion layer 22 may be suppressed.

As the atmosphere in which the heat treatment is performed, any atmosphere containing an $N_2$ gas may be used. However, when the concentration of an $N_2$ gas in an atmosphere in which the heat treatment is performed is too low, the Ti film 54 may not be nitrided, so that the concentration of an $N_2$ gas in an atmosphere in which the heat treatment is performed is preferably set in the range of 50% to 100%. In addition, since the Ti film 54 may not be nitrided when the heat treatment temperature is too low, the heat treatment temperature is preferably set in the range of 450 to 650° C.

Figure 16A:
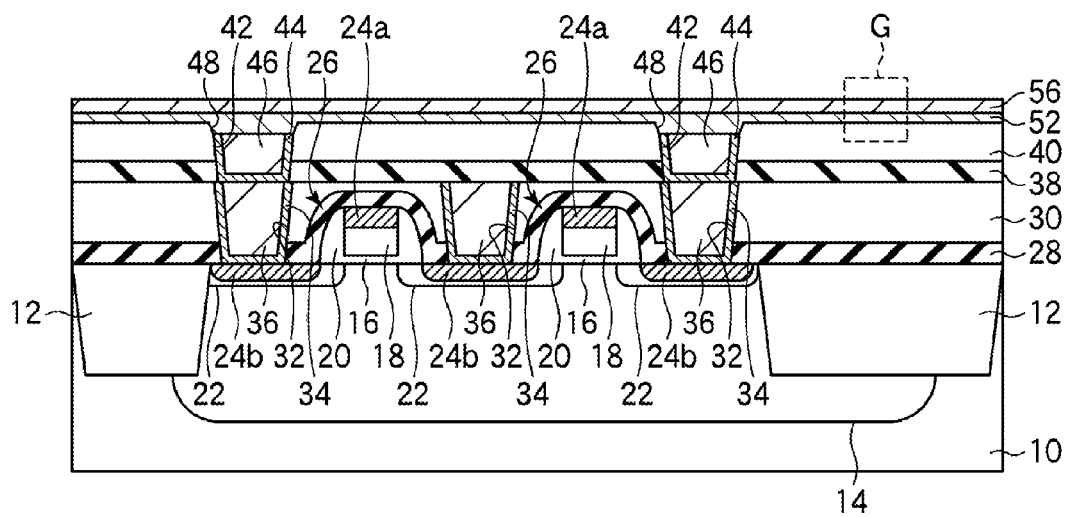

Since the Ti film 54 is nitrided as described above, the second underlying conductive film 56 composed of a (111) oriented and nitrided Ti film is obtained (see FIG. 16A). In the second underlying conductive film 56, the upper layer portion thereof in the region above the interlayer insulating film 40 and in the regions above the conductive plugs 46 is nitrided.

Figure 16B:
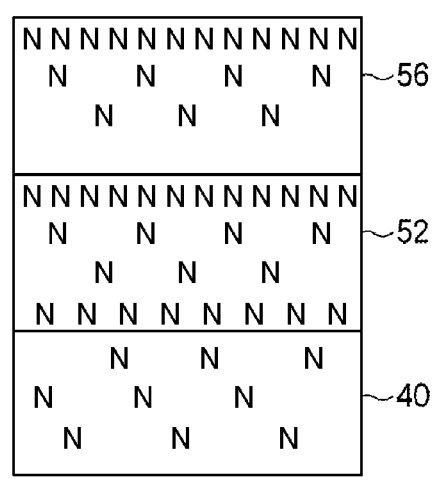

FIG. 16B is an enlarged cross-sectional view of a portion G surrounded by the dotted line in FIG. 16A. As illustrated in the figure, the nitrogen concentration in the second underlying conductive film 56 in the region above the interlayer insulating film 40 gradually decreases from the upper surface to the inside. The nitrogen concentration in the second underlying conductive film 56 also gradually decreases in the region above the conductive plug 46 from the upper surface to the inside.

When the upper layer portion of the second underlying conductive film 56 is nitrided as described above, in a heat treatment performed in an atmosphere containing oxygen to recover electrical properties of the ferroelectric capacitor 72, the second underlying conductive film 56 may be prevented from being oxidized by oxygen diffused from above. Accordingly, the conductivity of the second underlying conductive film 56 may be preferably maintained.

In addition, since the second underlying conductive film 56 is also nitrided, the resistance thereof against a chemical liquid used for wet etching, which is performed as a post treatment after the ferroelectric capacitor 72 is formed, is improved as compared to the resistance of a Ti film. Hence, in the wet etching performed as a post treatment after the ferroelectric capacitor 72 is formed, the second underlying conductive film 56 is not removed by etching.

In addition, since the entire second underlying conductive film 56 is not uniformly nitrided, compared to the case in which the entire second underlying conductive film 56 is uniformly nitrided, the expansion of the second underlying conductive film 56 is suppressed. In the second underlying conductive film 56 described above, the strain in the crystal is reduced. Accordingly, it is possible to form a film having a desirable crystalline orientation on the second underlying conductive film 56 in which the strain in the crystal is reduced as described above.

Figure 17:
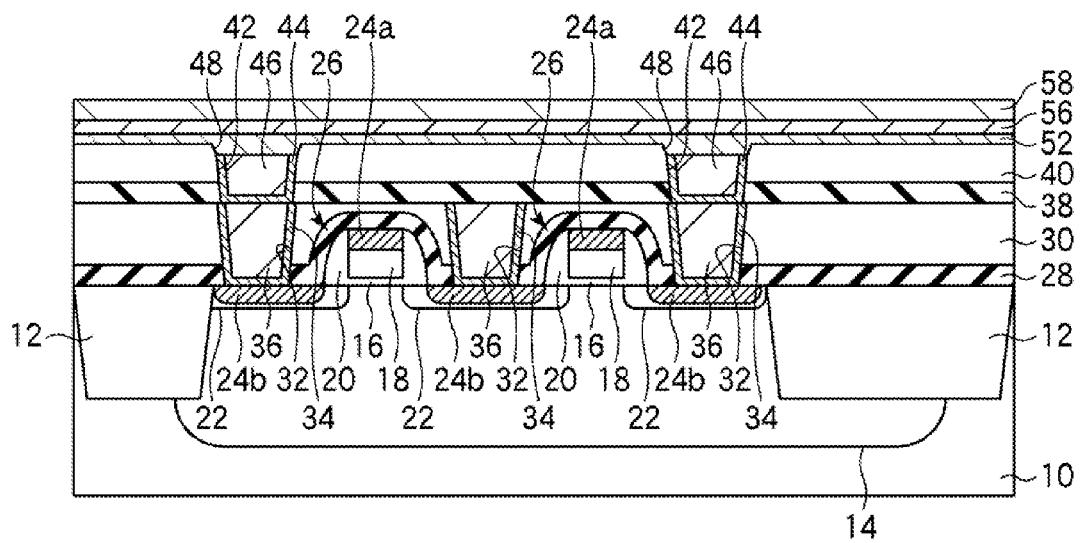

Next, by a reactive sputtering method or the like, the conductive oxygen barrier film (oxygen diffusion-preventing film) 58 is formed on the second underlying conductive film 56 (see FIG. 17). As the oxygen barrier film 58, for example, a TiAlN film having a thickness of, for example, 100 nm is formed. The oxygen barrier film 58 is a film to reduce if not prevent the upper surface of the conductive plug 46 from being oxidized after the conductive plug 46 is buried in the interlayer insulating film 40. Since being provided on the flat second underlying conductive film 56, the oxygen barrier film 58 is formed to have a desirable crystalline orientation. In addition, the upper surface of the oxygen barrier film 58 is formed flat.

Conditions for forming the oxygen barrier film 58 are set, for example, as follows. A TiAl alloy target is used as a target. As the atmosphere in a film-formation chamber, a mixed-gas atmosphere of an Ar gas and a nitrogen gas is used. The flow rate of an Ar gas supplied into the film-formation chamber is set, for example, to 40 sccm. The flow rate of a nitrogen gas supplied into the film-formation chamber is set, for example, to 10 sccm. The pressure in the film-formation chamber is set, for example, to 253.3 Pa. The substrate temperature is set, for example, to 400° C. A sputtering power is set, for example, to 1.0 kW.

In this embodiment, although the case in which a TiAlN film is used as the oxygen barrier film 58 is described by way of example, the oxygen barrier film 58 is not limited to a TiAlN film. As the oxygen barrier film 58, for example, an $SrRuO_3$ film may also be used.

Figure 18:
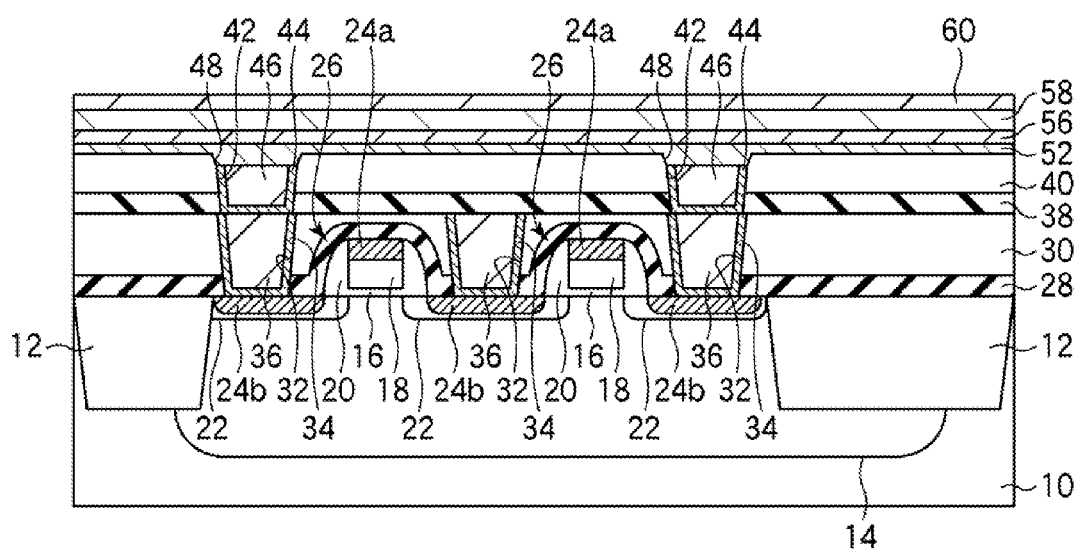

Next, by a sputtering method or the like, an Ir film 60 having a thickness, for example, of 60 to 100 nm is formed on the oxygen barrier film 58 (see FIG. 18). The Ir film 60 is a film formed to become the lower electrode of the ferroelectric capacitor 72. Since being provided on the flat oxygen barrier film 58, the Ir film 60 is formed to have a desirable crystalline orientation. In addition, the upper surface of the Ir film 60 is formed flat.

Conditions for forming the Ir film 60 are set, for example, as follows. The pressure in the film-formation chamber is set to 0.2 Pa. As the atmosphere in the film-formation chamber, for example, an Ar atmosphere may be used. The substrate temperature is set, for example, to 450° C. A DC power to be supplied is set, for example, to 0.3 kw.

In this embodiment, although the case in which an Ir film is used as a conductive film to be formed as the lower electrode 60 is described by way of example, the conductive film to be formed into the lower electrode 60 is not limited to an Ir film. As the conductive film formed into the lower electrode 60, for example, an $SrRuO_3$ film may also be used.

Next, by an RTA method or the like, a heat treatment is performed in an inert gas atmosphere containing an Ar gas or the like. The temperature of the heat treatment is set, for example, to 650 to 750° C. The time of the heat treatment is set, for example, to 60 seconds. By this heat treatment, the crystallinity of the Ir film 60 is improved, and in addition, the adhesion between the first underlying conductive film 52 and the second underlying conductive film 56, the adhesion between the second underlying conductive film 56 and the oxygen barrier film 58, and the adhesion between the oxygen barrier film 58 and the Ir film 60 are improved.

Subsequently, the ferroelectric film 62 is formed on the Ir film 60. As the ferroelectric film 62, a PZT film is formed. When a PZT film is formed as the ferroelectric film 62, after the initial layer 62a and the core layer 62b are formed, for example, by an MOCVD method, the surface layer portion 62c is formed by a sputtering method.

The initial layer 62a and the core layer 62b of the ferroelectric film 62 are formed, for example, by an MOCVD method as described below.

First, the semiconductor substrate 10 processed by the preceding steps including the step of forming the Ir film 60 is placed at a specific position in a reaction chamber of an MOCVD apparatus. Next, an oxygen ($O_2$) gas is supplied into the reaction chamber at a flow rate, for example, of 2,000 sccm. While an oxygen gas is contained in the reaction chamber, the substrate is heated to a specific film-formation temperature. After the substrate is heated to the specific film-formation temperature, a time interval is set before supplying a source gas of PZT into the reaction chamber to start the film formation of the initial layer 62a. During this interval, the flow rates of an Ar gas and an $O_2$ gas to be supplied into the reaction chamber are set to the flow rates for forming the initial layer 62a. For example, the flow rate of an Ar gas is set to 1,375 sccm, and the flow rate of an $O_2$ gas is set to 625 sccm. The ratio of the $O_2$ gas in a mixed-gas atmosphere to form the initial layer 62a is set such that the amount of $O_2$ in the reaction chamber is, for example, 0.33 times the amount of oxygen desired for reaction with organic metal components in the source gas of PZT. As described above, after the flow rates of an Ar gas and an $O_2$ gas are set to form the initial layer 62a, the source gas of PZT is supplied into the reaction chamber to start the film formation of the initial layer 62a.

The source gas of PZT is formed by vaporizing individual liquid sources of Pb, Zr, and Ti. The individual liquid sources of Pb, Zr, and Ti are prepared in advance as described below.

The liquid source of Pb is prepared by dissolving bis(dimethylheptane dionate)lead ($Pb(DMHD)_2$) in a butyl acetate solvent at a concentration of 0.2 mol/liter. The liquid source of Zr is prepared by dissolving tetrakis(dimethylheptane dionate)zirconium ($Zr(DMHD)_4$) in a butyl acetate solvent at a concentration of 0.1 mol/liter. The liquid source of Ti is prepared by dissolving bis(isopropoxy)bis(dipivaloylmethanate)titanium ($Ti(O-iPr)_2(DPM)_2$) in a butyl acetate solvent at a concentration of 0.1 mol/liter.

The source gas of PZT is formed by supplying the liquid sources of Pb, Zr, and Ti into a vaporizer of the MOCVD apparatus with a butyl acetate solvent, followed by vaporizing the liquid sources in the vaporizer. When the PZT film is formed, the flow rates of the individual liquid sources of Pb, Zr, and Ti and the flow rate of the butyl acetate solvent are controlled so that the total flow rate to the vaporizer is, for example, to 1.2 ml/minute.

In addition, when the flow rates of the individual liquid sources and the solvent to the vaporizer are appropriately controlled, the film-formation rate of PZT may be set to a desired value. For example, when the film-formation rate is set to 0.04 nm/sec, the flow rate of the butyl acetate solvent is set to 0.95 ml/min, and the flow rates of the liquid sources of Pb, Zr, and Ti are set to 0.1 ml/minute, 0.07 ml/minute, and 0.08 ml/minute, respectively. In addition, when the film-formation rate is set to 0.17 nm/sec, the flow rate of the butyl acetate solvent is set to 0.30 ml/minute, and the flow rates of the liquid sources of Pb, Zr, and Ti are set to 0.26 ml/minute, 0.34 ml/minute, and 0.30 ml/minute, respectively.

When the source gas as described above is supplied into the reaction chamber while an Ar gas and an $O_2$ gas are supplied at flow rates to form the initial layer 62a, the initial layer 62a is formed, for example, to have a thickness of 2.5 to 10 nm. When the crystalline orientation of a film used as an underlayer of the initial layer 62a is controlled, the initial layer 62a may be formed in which the (111) plane is preferentially oriented.

When the thickness of the initial layer 62a is less than 2.5 nm, the crystalline orientation of the initial layer 62a may be degraded in some cases. In addition, when the thickness of the initial layer 62a is more than 10 nm, the amount of switching charge of the ferroelectric capacitor 72 may be decreased in some cases due to the influences of oxygen deficiency and the like. Hence, the thickness of the initial layer 62a is preferably set in the range of 2.5 to 10 nm.

After the initial layer 62a is formed, the supply of the source gas into the reaction chamber is stopped, and a time interval is set before supplying the source gas of PZT into the reaction chamber to start the film formation of the core layer 62b. During this interval, the flow rates of Ar gas and oxygen gas to be supplied into the reaction chamber are changed to the flow rates for forming the core layer 62b. For example, the flow rate of Ar gas is changed to 0 sccm, and the flow rate of $O_2$ gas is changed to 4,500 sccm. The ratio of $O_2$ gas in a mixed-gas atmosphere to form the core layer 62b is set such that the amount of $O_2$ in the reaction chamber is, for example, 6.77 times the amount of $O_2$ desired for reaction with the organic metal components in the source gas of PZT. After the flow rates of Ar gas and $O_2$ gas are changed to the flow rates for forming the core layer 62b, the source gas of PZT is again supplied into the reaction chamber to start the film formation of the core layer 62b.

Since the amount of $O_2$ in the reaction chamber into which the source gas is supplied is excessive when the core layer 62b is formed, the core layer 62b may have a small oxygen deficiency. In addition, since being provided on the initial layer 62a in which the (111) plane is preferentially oriented, the core layer 62b may be formed so that the (111) plane is preferentially oriented.

While the initial layer 62a and the core layer 62b are formed by an MOCVD method as described above, the pressure inside the reaction chamber is set, for example, to 665 Pa. In addition, the substrate temperature is set, for example, to 620° C. In addition, the time for supplying the source gas into the reaction chamber is set, for example, to 620 seconds in total. As a result, the initial layer 62a and the core layer 62b are formed so that the total thickness thereof is, for example, 100 nm.

In addition, when the initial layer 62a and the core layer 62b are formed as described above, the film-formation rate of the initial layer 62a is preferably set relatively low. On the other hand, the film-formation rate of the core layer 62b is preferably set higher than that of the initial layer 62a. For example, the film-formation rate of the initial layer 62a is set to 0.1 nm/sec or less, preferably 0.05 nm/sec or less, and more preferably 0.04 nm/sec or less. In addition, the film-formation rate of the core layer 62b is set to 0.17 nm/sec. The reason for this is that when the film-formation rate of the initial layer 62a is higher than 0.1 nm/sec, the morphology of the core layer 62b formed on the initial layer 62a is degraded. When the morphology of the core layer 62b is degraded, the amount of switching charge of the ferroelectric capacitor 72 is decreased. For example, when the initial layer 62a is formed at a film-formation rate of 0.1 nm/sec or less, the amount of switching charge of the ferroelectric capacitor 72 is 40 $\mu C/cm^2$. On the other hand, when the initial layer 62a is formed at the same film-formation rate as that of the core layer 62b, such as 0.17 nm/sec, the amount of switching charge of the ferroelectric capacitor 72 may be decreased to 32 $\mu C/cm^2$.

After the initial layer 62a and the core layer 62b are formed by an MOCVD method as described above, the surface layer portion 62c of the ferroelectric film 62 is formed on the core layer 62b by a sputtering method. The thickness of the surface layer portion 62c is set, for example, to 10 nm. Conditions for forming the surface layer portion 62c are set, for example, as follows. The pressure inside a film-formation chamber is set, for example, to 1.0 Pa. The substrate temperature is set, for example, to 50° C. A DC power to be supplied is set, for example, to 1 kW. The time for supplying a DC power is set, for example, to 19 seconds.

Figure 19:
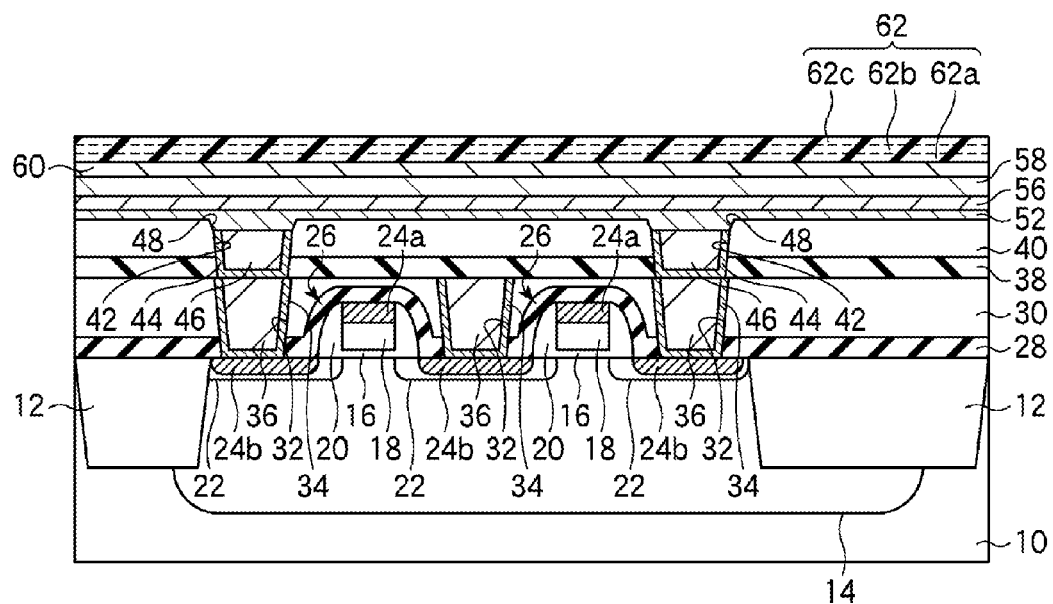

As described above, the initial layer 62a and the core layer 62b are formed by an MOCVD method, and the surface layer portion 62c is formed by a sputtering method, so that the ferroelectric film 62 of the ferroelectric capacitor 72 is formed (see FIG. 19).

In this embodiment, the recess portion 48 formed where the conductive plug 46 is buried is filled with the first underlying conductive film 52, and above this first underlying conductive film 52, the oxygen barrier film 58 and the lower electrode 60 are sequentially formed. Furthermore, the upper surface of the first underlying conductive film 52 is formed flat. Hence, in this embodiment, the oxygen barrier film 58 and the lower electrode 60 are each formed flat, so that a desirable crystalline orientation may be obtained. The ferroelectric film 62 is formed on the lower electrode 60 which has a desirable crystalline orientation and a flat surface. Hence, according to this embodiment, the ferroelectric film 62 may be formed to have a desirable crystalline orientation. As a result, according to this embodiment, a semiconductor device may be provided which includes the ferroelectric capacitors 72 having desirable electrical properties and high reliability.

Furthermore, when the second underlying conductive film 56 is formed on the first underlying conductive film 52, and the oxygen barrier film 58 and the lower electrode 60 are sequentially formed on the second underlying conductive film 56, the oxygen barrier film 58 and the lower electrode 60 may both be reliably formed flat. Hence, the ferroelectric film 62 having a desirable crystalline orientation may be reliably formed.

Next, by a sputtering method or the like, the first conductive film 64 to be used as part of the upper electrode 70 is formed on the ferroelectric film 62. As this first conductive film 64, for example, a crystalline $IrO_x$ film is formed. The thickness of the $IrO_x$ film is set, for example, to approximately 25 nm. The oxygen composition ratio X of the $IrO_x$ film is set, for example, to approximately 1.5 to 1.8.

Conditions for forming the $IrO_x$ film used as the first conductive film 64 are set, for example, as follows. The substrate temperature is set, for example, to 300° C. As the atmosphere in a film-formation chamber, a mixed-gas atmosphere of an Ar gas and an $O_2$ gas may be used. The flow rate of an Ar gas is set, for example, to 140 sccm. The flow rate of an $O_2$ gas is set, for example, to 60 sccm. A sputtering power is set, for example, to 1 to 2 kW.

Subsequently, by an RTA method or the like, a heat treatment is performed in an atmosphere containing oxygen. This heat treatment is performed to sufficiently crystallize the ferroelectric film 62, to recover the damage done on the ferroelectric film 62 caused by plasma used during the formation of the first conductive film 64, and to compensate the ferroelectric film 62 for oxygen deficiency.

Conditions for performing this heat treatment are set, for example, as follows. The temperature of the heat treatment is set, for example, to approximately 725° C. As the atmosphere in a chamber, a mixed-gas atmosphere of an Ar gas and an $O_2$ gas may be used. The flow rate of an Ar gas is set to, for example, 2,000 sccm. The flow rate of an $O_2$ gas is set, for example, to 20 sccm. The time of the heat treatment is set, for example, to 60 seconds.

Next, by a sputtering method or the like, the second conductive film 66 to be used as part of the upper electrode 70 is formed on the first conductive film 64. As this second conductive film 66, for example, an $IrO_y$ film having a thickness of 50 to 150 nm is formed. This $IrO_y$ film preferably has a stoichiometric composition. That is, the oxygen composition ratio Y of the $IrO_y$ film is preferably set to 2. The reason the $IrO_y$ film is formed to have a stoichiometric composition is to prevent the $IrO_y$ film from performing a catalytic action on hydrogen, so that the ferroelectric film 62 is prevented from being reduced by hydrogen radicals. When an $IrO_y$ film having a stoichiometric composition is formed as the second conductive film 66, the electrical properties of the ferroelectric capacitor 72 are reduced if not prevented from being degraded by hydrogen.

Conditions for forming the $IrO_y$ film as the second conductive film 66 are set, for example, as follows. As the atmosphere in a film-formation chamber, a mixed-gas atmosphere of an Ar gas and an $O_2$ gas is used. The flow rate of an Ar gas is set, for example, to 100 sccm. The flow rate of an $O_2$ gas is set, for example, to 90 sccm. The pressure inside the film-formation chamber is set, for example, to 0.8 Pa. A sputtering power is set, for example, to 1.0 kW. The substrate temperature is set, for example, to 100° C. or less in order to suppress abnormal growth of the $IrO_y$ film. When the film formation is performed, for example, for 45 seconds under the conditions as described above, the thickness of the $IrO_y$ film is, for example, approximately 125 nm.

In this embodiment, although the case in which an $IrO_y$ film is used as the second conductive film 66, which is used as part of the upper electrode 70, is described by way of example, the second conductive film 66 is not limited to an $IrO_y$ film. For example, Ir, Ru, Ru oxide, Rh, Rh oxide, Re, Re oxide, Os, Os oxide, Pd, and/or Pd oxide may also be used as a material for the second conductive film 66. In addition, a conductive oxide, such as $SrRuO_3$, may also be used as a material for the second conductive film 66. Furthermore, a laminate film using the materials mentioned above may be used as the second conductive film 66.

Figure 20:
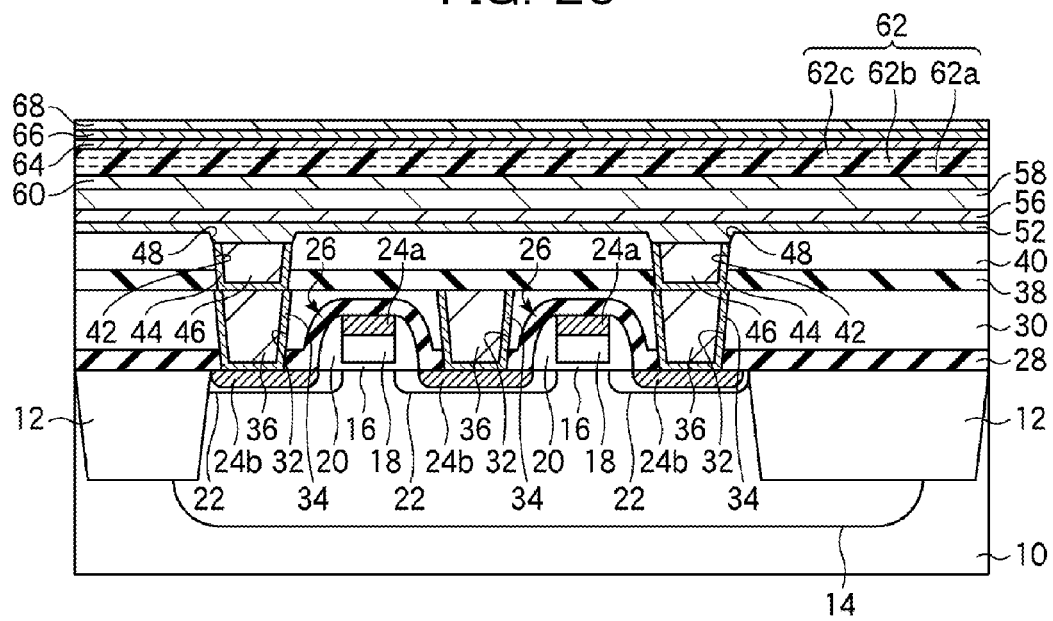

Next, by a sputtering method or the like, the third conductive film 68 which is used as part of the upper electrode 70 is formed on the second conductive film 66 (see FIG. 20). As this third conductive film 68, for example, an Ir film having a thickness of 50 to 100 nm is formed. This third conductive film 68 functions as a hydrogen barrier film (hydrogen diffusion-preventing film) which reduces if not prevents the ferroelectric film 62 from being reduced by hydrogen. In addition, the third conductive film 68 also functions as a conduction improving film to ensure a desirable electrical connection between the upper electrode 70 and the conductive plug 88.

Conditions for forming the Ir film used as the third conductive film 68 are set, for example, as follows. As the atmosphere in a film-formation chamber, an Ar gas atmosphere is used. The pressure in the film-formation chamber is set, for example, to 1 Pa. A sputtering power is set, for example, to 1.0 kW.

As a result, the first to the third conductive films 64, 66, and 68 to be formed into the upper electrode 70 of the ferroelectric capacitor 72 are formed. Since being provided on the flat ferroelectric film 62, the first to the third conductive films 64, 66, and 68 are each formed with a desirable crystalline orientation.

In this embodiment, although the case in which a laminate film including the first to the third conductive films 64, 66, and 68 is formed as a conductive film used as the upper electrode 70 is described by way of example, the conductive film used as the upper electrode 70 is not limited to a laminate film. As the conductive film used as the upper electrode 70, for example, a Pt film or an $SrRuO_3$ film may also be used.

Next, the lower surface (rear surface) of the semiconductor substrate 10 is cleaned.

Subsequently, by a sputtering method or the like, a TiN film 98 is formed to have a thickness, for example, of 200 nm. This TiN film 98 is formed as part of a hard mask which is used when the upper electrode 70, the ferroelectric film 62, the lower electrode 60, the oxygen barrier film 58, the second underlying conductive film 56, and the first underlying conductive film 52 are patterned. However, instead of the TiN film 98, a TiAlN film may also be formed.

Figure 21:
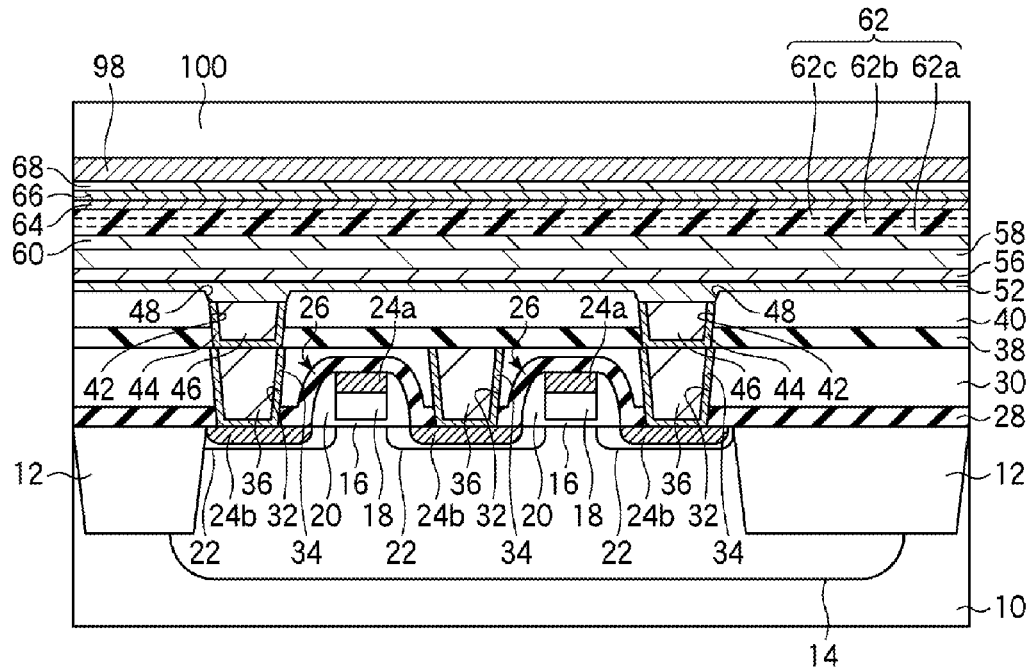

Next, for example, by a plasma CVD method using TEOS as a source gas, a silicon oxide film 100 is formed to have a thickness, for example, of 700 nm (see FIG. 21). The silicon oxide film 100 is a film to form the hard mask together with the TiN film 98, and as described above, the hard mask thus formed is used when the upper electrode 70, the ferroelectric film 62, the lower electrode 60, the oxygen barrier film 58, the second underlying conductive film 56, and the first underlying conductive film 52 are patterned.

Figure 22:
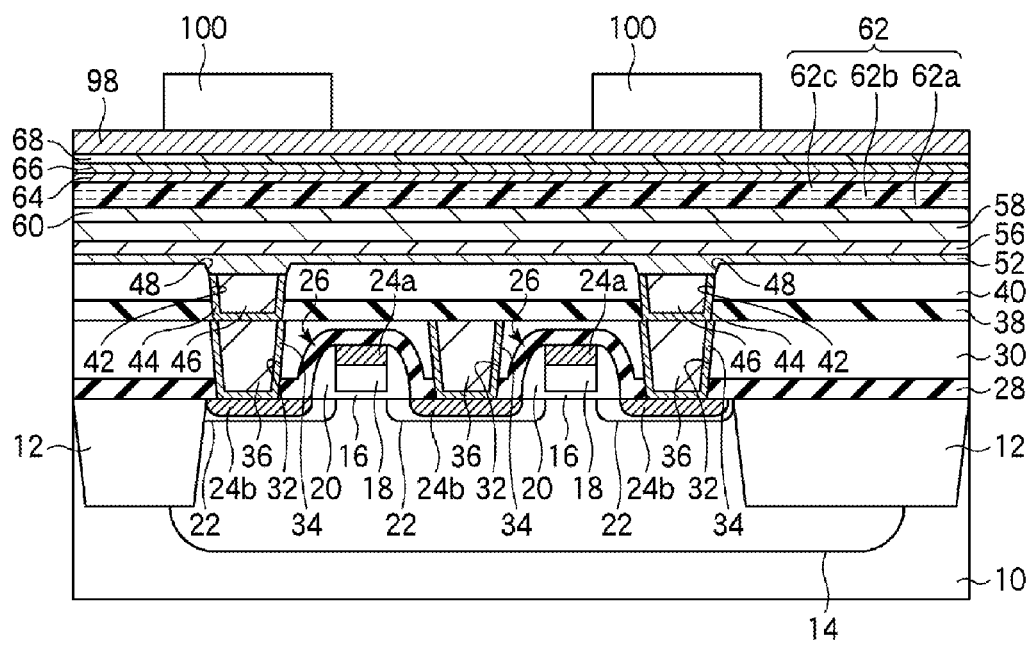
Figure 23:
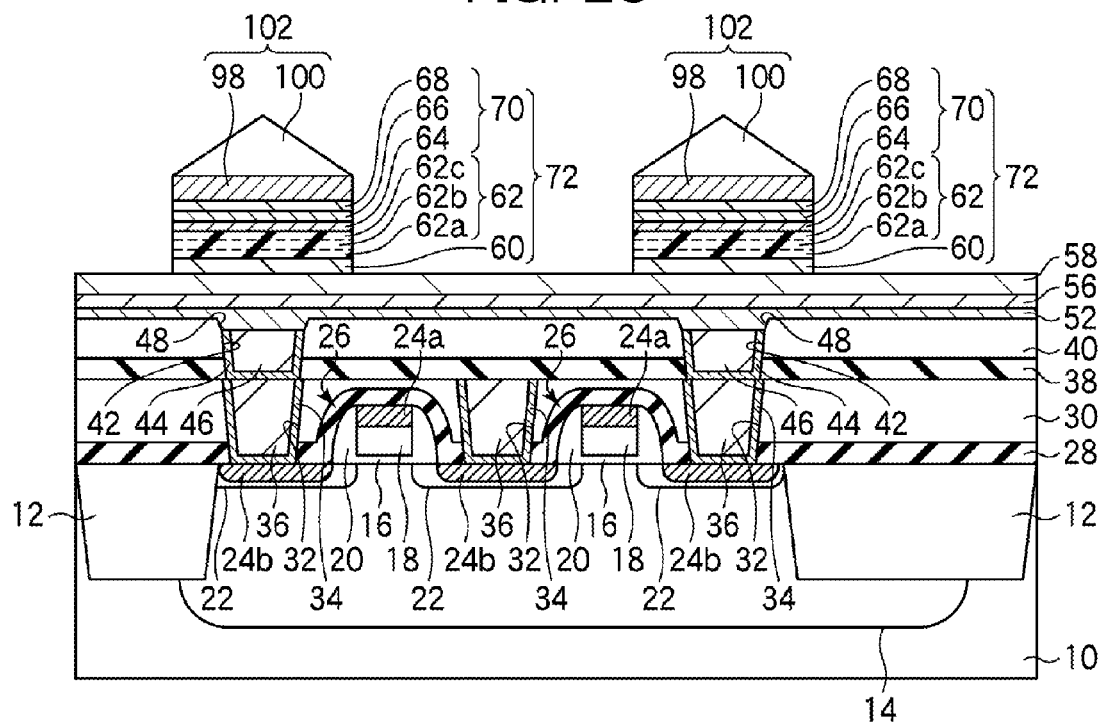

Next, by a photolithographic technique, the silicon oxide film 100 is patterned to the planar shape of the ferroelectric capacitor 72 (see FIG. 22).

Subsequently, the TiN film 98 is patterned by using the silicon oxide film 100 as a mask. As a result, a hard mask 102 is formed from the TiN film 98 and the silicon oxide film 100.

Next, by a plasma etching method using the hard mask 102 as a mask, the third conductive film 68, the second conductive film 66, the first conductive film 64, the ferroelectric film 62, and the Ir film 60 are patterned. As an etching gas, for example, a mixed gas containing an HBr gas, an $O_2$ gas, an Ar gas, and a $C_4F_8$ gas is used. Accordingly, the ferroelectric capacitor 72 including the lower electrode 60, the ferroelectric film 62, and the upper electrode 70 is formed (see FIG. 23). The lower electrode 60 is formed of the Ir film. The upper electrode 70 is formed of the first to the third conductive films 64, 66, and 68.

Figure 24:
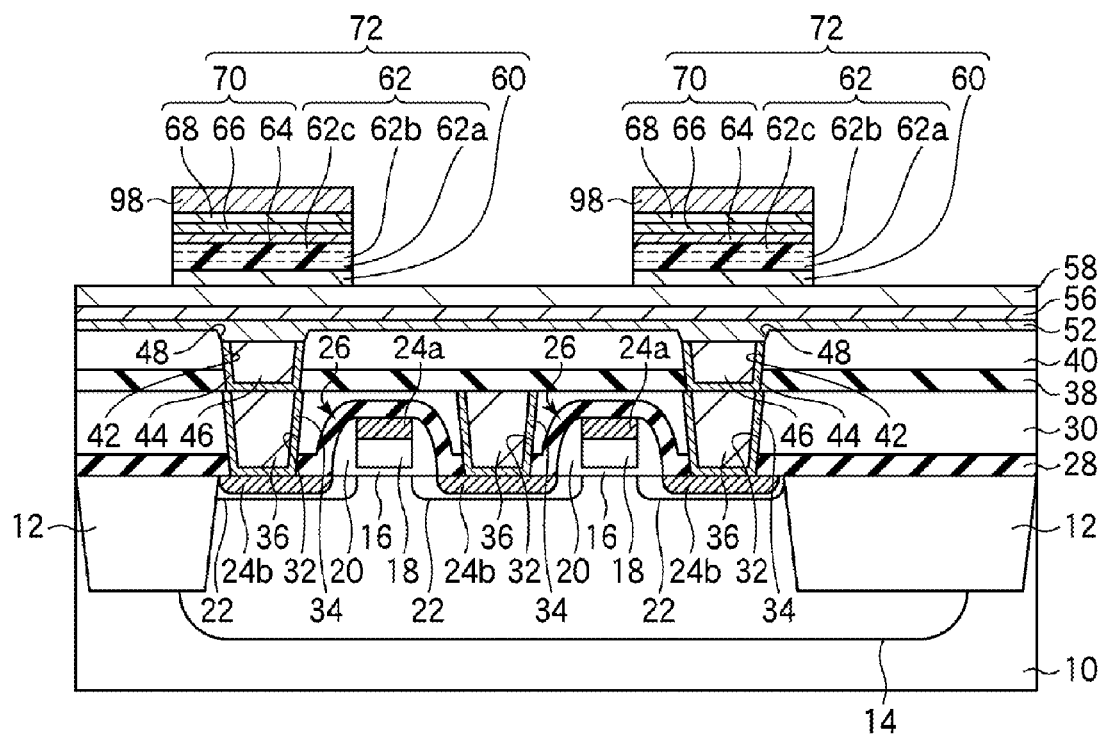
Figure 25:
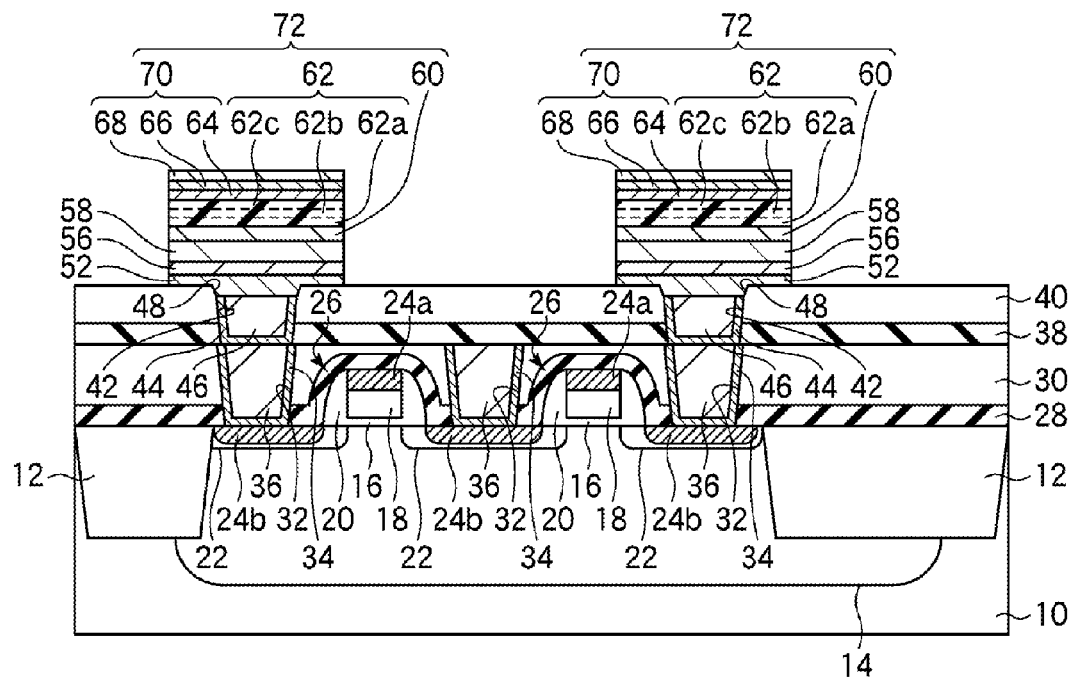

Subsequently, by dry etching or wet etching, the silicon oxide film 100 of the hard mask 102 is removed (see FIG. 24).

In this embodiment, the first underlying conductive film 52 and the second underlying conductive film 56 are each nitrided. Hence, the resistance of the first underlying conductive film 52 and the resistance of the second underlying conductive film 56 against a chemical liquid used for wet etching performed as a post treatment after the formation of the ferroelectric capacitor 72 are improved. Accordingly, for example, when the silicon oxide film 100 is removed by wet etching as described above, the first underlying conductive film 52 and the second underlying conductive film 56 are not removed by etching.

Next, by dry etching using the TiN film 98 as a mask, the oxygen barrier film 58, the second underlying conductive film 56, and the first underlying conductive film 52 are etched. In this step, the TiN film 98 present on the ferroelectric capacitor 72 is also removed by etching (see FIG. 25).

Figure 26:
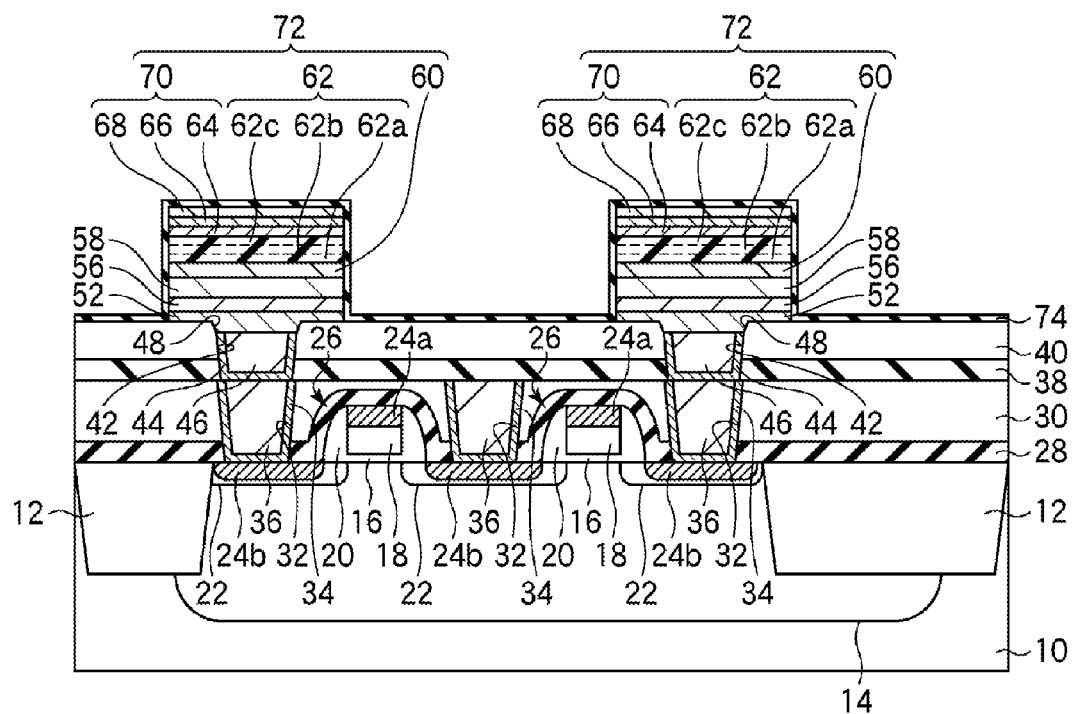

Subsequently, by an MOCVD method or the like, the hydrogen barrier film 74 is formed on the entire surface so as to cover the ferroelectric capacitor 72 (see FIG. 26). As the hydrogen barrier film 74, for example, an aluminum oxide film having a thickness of 2 to 5 nm is formed. The hydrogen barrier film 74 described above is a film to prevent the ferroelectric film 62 from being reduced by hydrogen. In addition, as the hydrogen barrier film 74, for example, an aluminum oxide film having a thickness of 20 nm may be formed by a sputtering method.

Figure 27:
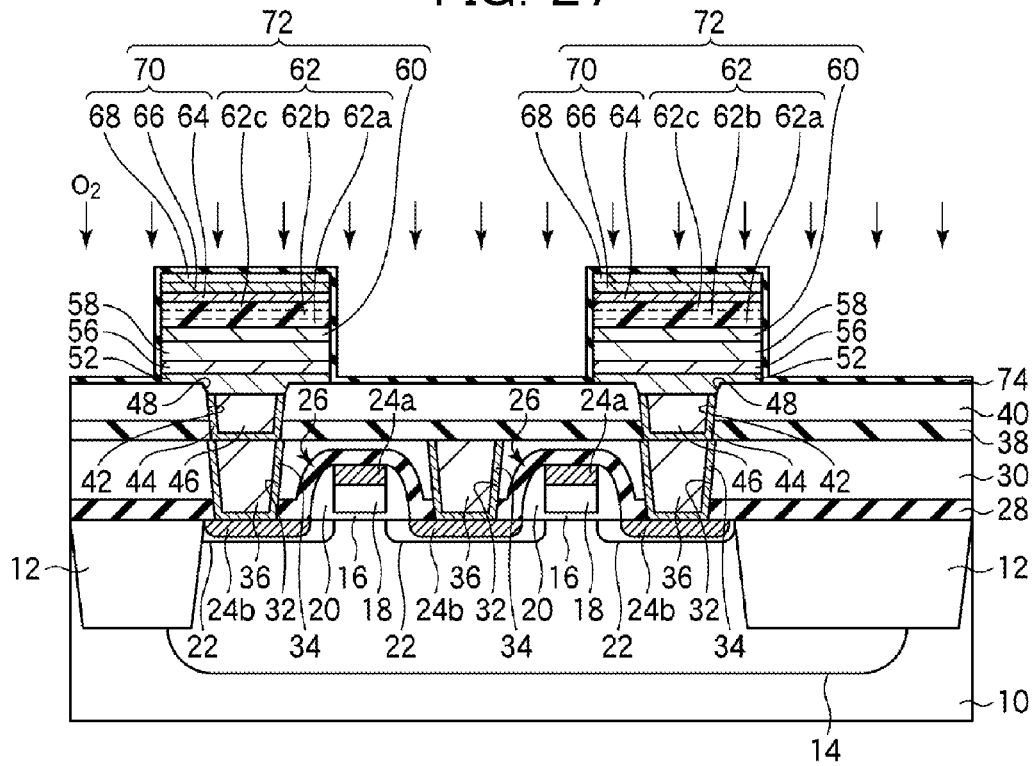

Next, a heat treatment is performed in an atmosphere containing oxygen (see FIG. 27). This heat treatment improves the film quality of the ferroelectric film 62 by supplying oxygen thereto so as to enable the ferroelectric capacitor 72 to have desirable electrical properties.

The substrate temperature at which the heat treatment is performed is set, for example, from 550 to 700° C. When a PZT film is used as the ferroelectric film 62, the substrate temperature is set, for example, to 600° C., and the time for the heat treatment is set, for example, to 60 minutes. However, the heat treatment conditions are not limited to those described above and may be appropriately determined.

In this embodiment, the upper layer portion of the first underlying conductive film 52 and that of the second underlying conductive film 56 are each nitrided. Hence, when the heat treatment is performed in an atmosphere containing oxygen to recover electrical properties of the ferroelectric capacitor 72, as described above, the first underlying conductive film 52 and the second underlying conductive film 56 are prevented from being oxidized by oxygen diffused from above. As a result, the conductivity of the first and the second underlying conductive films 52 and 56 may be preferably maintained.

Figure 28:
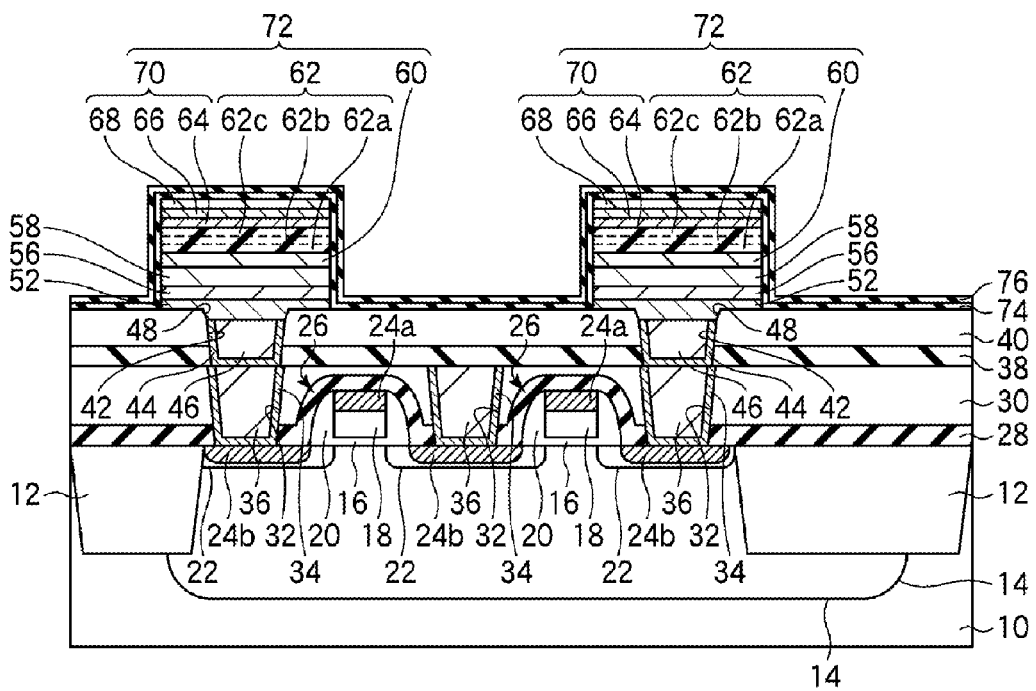
Figure 29:
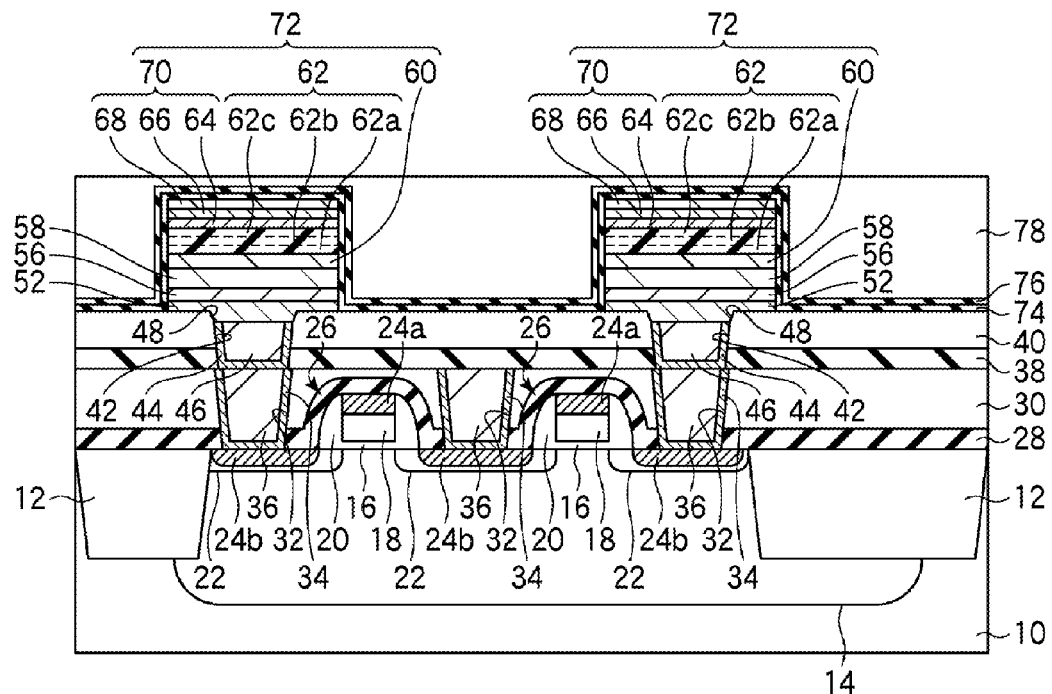

Next, by an MOCVD method or the like, the hydrogen barrier film 76 is formed on the entire surface (see FIG. 28). As the hydrogen barrier film 76, for example, an aluminum oxide film having a thickness of 38 nm is formed. The hydrogen barrier film 76 described above is a film to prevent the ferroelectric film 62 from being reduced by hydrogen.

Subsequently, by a plasma CVD method or the like, the interlayer insulating film 78 is formed on the entire surface. As the interlayer insulating film 78, for example, a silicon oxide film having a thickness of 1,500 nm is formed. As a source gas for forming the interlayer insulating film 78, for example, a mixed gas containing a TEOS gas, an oxygen gas, and a helium gas is used.

In this embodiment, although the case in which a silicon oxide film is formed as the interlayer insulating film 78 is described by way of example, the interlayer insulating film 78 is not limited to a silicon oxide film. As the interlayer insulating film 78, an inorganic insulating film may also be appropriately used.

Next, by a CMP method or the like, the upper surface of the interlayer insulating film 78 is planarized. Accordingly, the interlayer insulating film 78 is formed, for example, to have a thickness of 800 nm (see FIG. 29).

Subsequently, a heat treatment is performed in a plasma atmosphere generated with an $N_2O$ gas or an $N_2$ gas. This heat treatment removes moisture contained in the interlayer insulating film 78 and also changes the film quality thereof so as to make moisture difficult to enter the interlayer insulating film 78.

Figure 30:
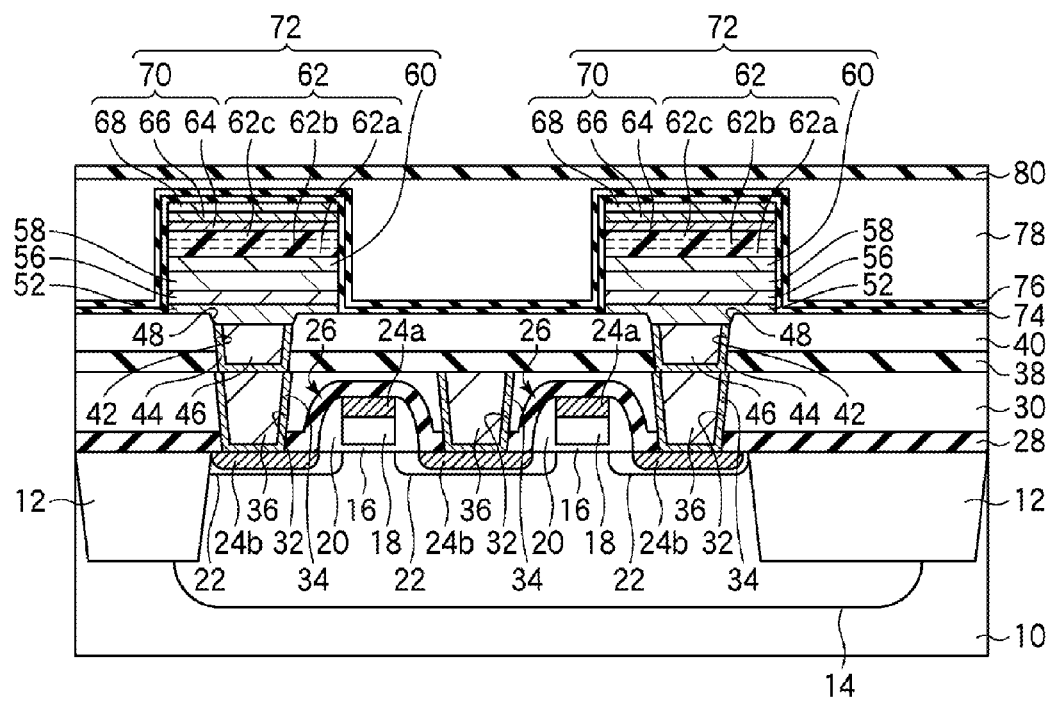

Next, by a sputtering method, a CVD method, or the like, the hydrogen barrier film 80 is formed on the interlayer insulating film 78 (see FIG. 30). As the hydrogen barrier film 80, for example, an aluminum oxide film having a thickness of 20 to 100 nm is formed. Since being provided on the planarized interlayer insulating film 78, the hydrogen barrier film 80 is formed flat.

Figure 31:
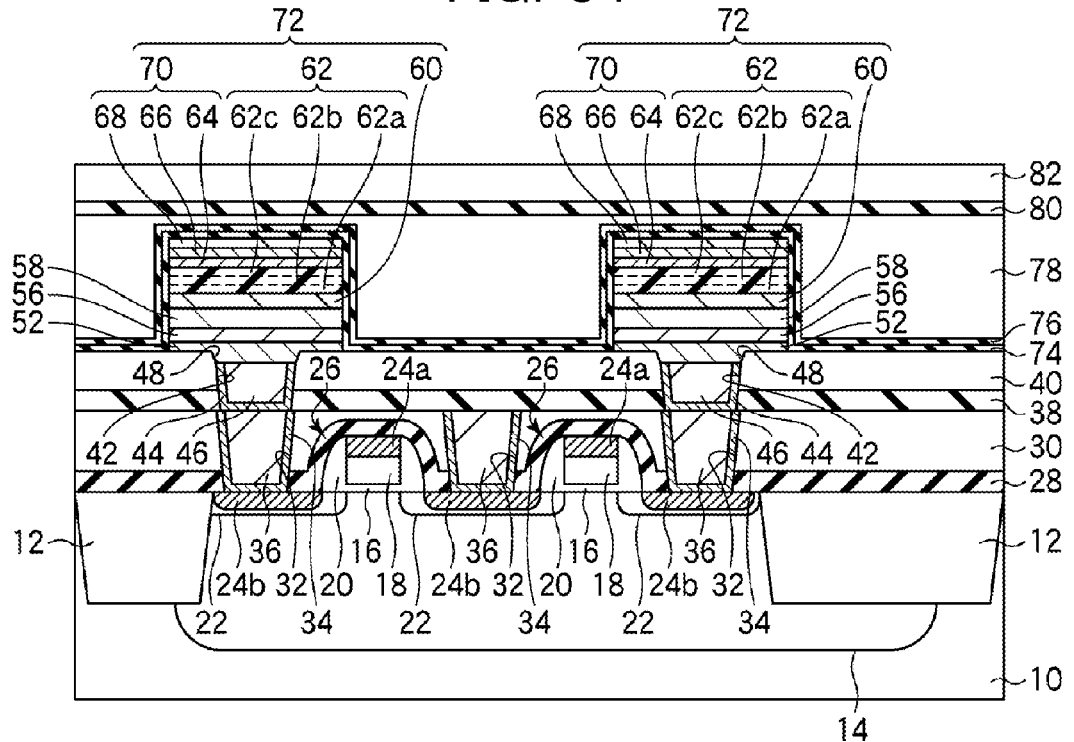
Figure 32:
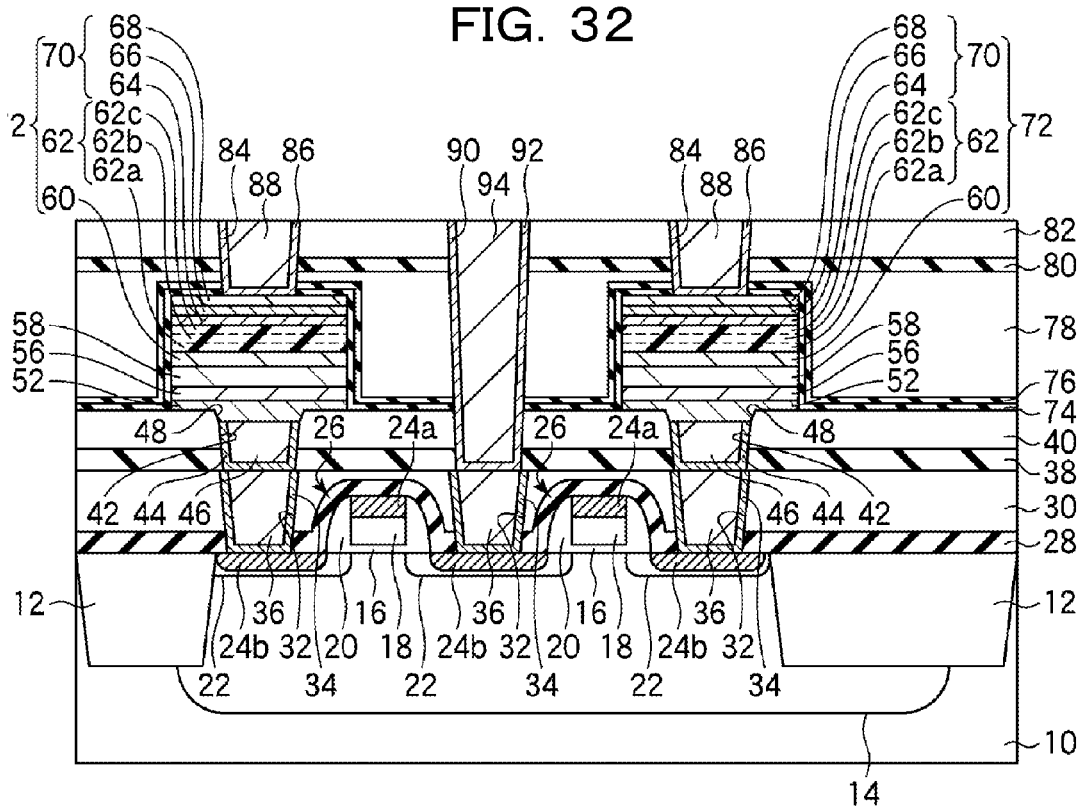
Figure 33:
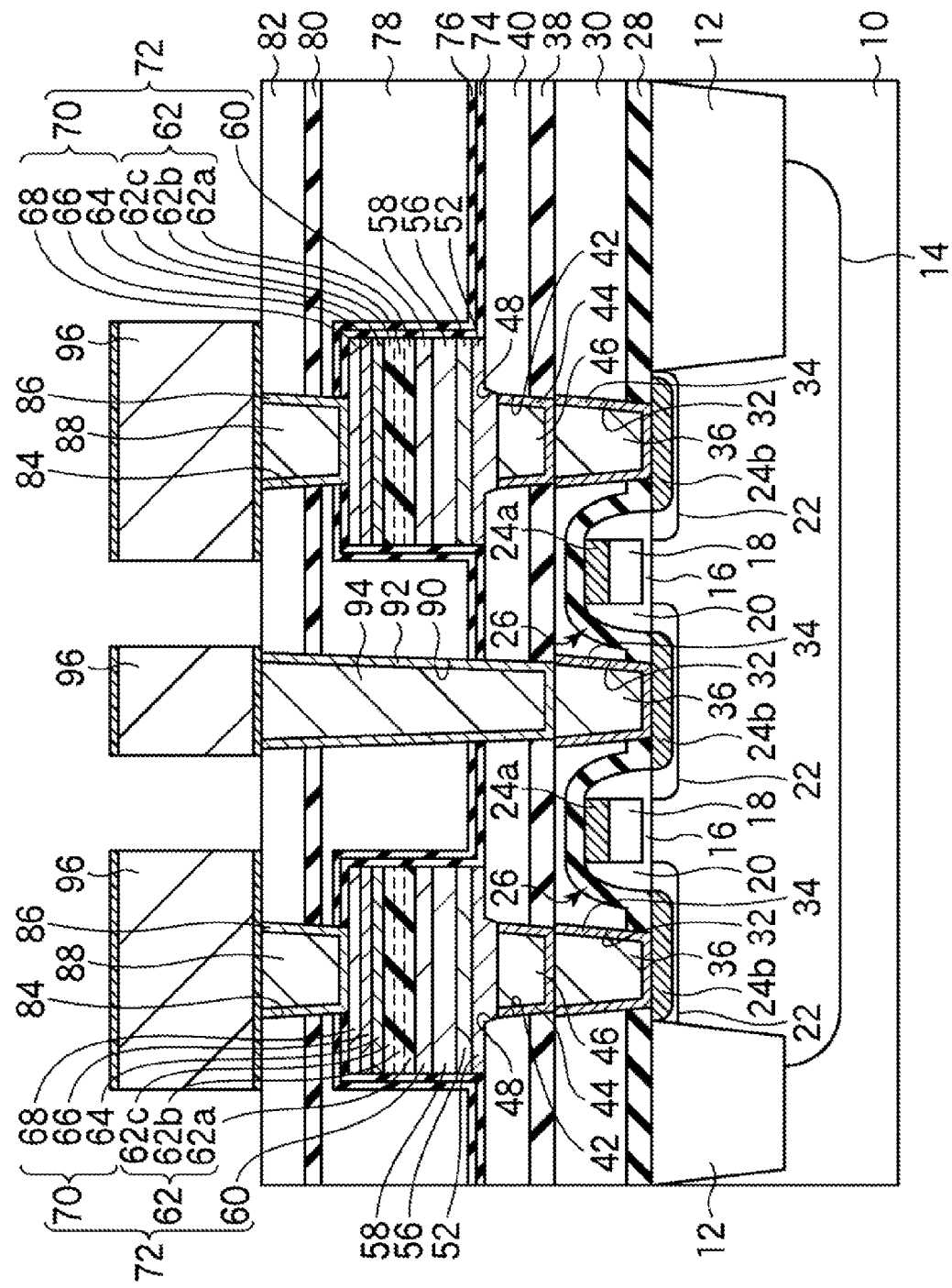

Subsequently, for example, by a plasma CVD method using TEOS as a source gas, the interlayer insulating film 82 is formed on the hydrogen barrier film 80 (see FIG. 31). Since being formed on the flat hydrogen barrier film 80, the interlayer insulating film 82 has a flat surface. As the interlayer insulating film 82, for example, a silicon oxide film having a thickness of 250 nm is formed.

In this embodiment, although the case in which a silicon oxide film is used as the interlayer insulating film 82 is described by way of example, the interlayer insulating film 82 is not limited to a silicon oxide film. For example, an SiON film or a silicon nitride film may also be formed as the interlayer insulating film 82.

Next, by a photolithographic technique, the contact hole 84 reaching the upper electrode 70 of the ferroelectric capacitor 72 is formed in the interlayer insulating film 82, the hydrogen barrier film 80, the interlayer insulating film 78, the hydrogen barrier film 76, and the hydrogen barrier film 74.

Subsequently, heat treatment is performed in an atmosphere containing oxygen. In this heat treatment, oxygen is supplied to the ferroelectric film 62 so as to recover the electrical properties of the ferroelectric capacitor 72. The substrate temperature at which the heat treatment is performed is set, for example, to 500° C.

Next, by a photolithographic technique, the contact hole 90 reaching the conductive plug 36 is formed in the interlayer insulating film 82, the hydrogen barrier film 80, the interlayer insulating film 78, the hydrogen barrier film 76, the hydrogen barrier film 74, the interlayer insulating film 40, and the oxidation-preventing film 38.

Subsequently, by a sputtering method or the like, the adhesion layers 86 and 92 are formed on the entire surface. As the adhesion layers 86 and 92, for example, a TiN layer having a thickness of 125 nm is formed.

Next, by a CVD method or the like, tungsten films 88 and 94 each having a thickness, for example, of 300 nm are formed on the entire surface.

Subsequently, by a CMP method or the like, the tungsten films 88 and 94 and the adhesion layers 86 and 92 are polished until the surface of the interlayer insulating film 82 is exposed. As a result, the conductive plugs 88 and 94 composed of tungsten are buried in the contact holes 84 and 90, respectively (see FIG. 32).

In this embodiment, although the case in which TiN films are formed as the adhesion layers 86 and 92 is described by way of example, the adhesion layers 86 and 92 are not limited to a TiN film. The adhesion layers 86 and/or 92 may be each formed of a laminate film composed of a Ti film and a TiN film in such a way that the Ti film is formed, for example, by a sputtering method and the TiN film is formed, for example, by an MOCVD method. In this case, in order to remove carbon from the TiN film of each of the adhesion layers 86 and 92, the adhesion layers 86 and 92 are processed by a plasma treatment in a plasma atmosphere generated using a mixed gas containing a nitrogen gas and a hydrogen gas. In this embodiment, at the topmost layer of the upper electrode 70, an Ir film functioning as a hydrogen barrier film is formed as the third conductive film 68. Accordingly, in this embodiment, when the adhesion layers 86 and 92 are processed by a plasma treatment, the $IrO_x$ film which is the first conductive film 64 of the upper electrode 70 and the $IrO_y$ film which is the second conductive film 66 thereof may be prevented from being reduced.

Next, by a sputtering method or the like, a Ti film having a thickness of, for example, 60 nm, a TiN film having a thickness of, for example, 30 nm, an AlCu alloy film having a thickness of, for example, 360 nm, a Ti film having a thickness of, for example, 5 nm, and a TiN film having a thickness of, for example, 70 nm are sequentially formed. Accordingly, a laminate film is formed in which the Ti film, the TiN film, the AlCu alloy film, the Ti film, and the TiN film are sequentially laminated to each other.

Subsequently, by a photolithographic technique, the laminate film is patterned. As a result, the wires (first metal wire layer) 96 are formed from the laminate film (see FIG. 33).

Next, a plurality of layers including at least one interlayer insulating film (not shown), at least one conductive plug (not shown), and at least one wire (not shown) is further formed on the interlayer insulating film 82 on which the wires 96 are formed. For example, wires from a second layer wire to a fifth layer wire are formed.

As described above, the semiconductor device according to this embodiment is manufactured.

According to this embodiment, since the first underlying conductive film 52 having a flat upper surface is formed on the conductive plug 46 and the interlayer insulating film 40, and above the first underlying conductive film 52, the lower electrode 60 and the ferroelectric film 62 are sequentially formed, even when the recess portion 48 is formed where the conductive plug 46 is buried, the ferroelectric film 62 may be formed to have a desirable crystalline orientation.

Furthermore, when the second underlying conductive film 56 is formed on the first underlying conductive film 52, and when the lower electrode 60 and the ferroelectric film 62 are sequentially formed above this second underlying conductive film 56, the ferroelectric film 62 may be reliably formed to have a desirable crystalline orientation. Hence, according to this embodiment, a semiconductor device may be provided which includes the ferroelectric capacitors 72 each having desirable electrical properties and high reliability.

In addition, after the upper surface of the Ti film 50 is polished by a CMP method at a polishing rate lower than that of a TiN film, the TiN film 50 is nitrided in a nitrogen atmosphere. Hence, the Ti film 50 may be stably polished with high controllability compared to that of a TiN film.

Modified Embodiment

The present invention may have various modified embodiments as well as the above embodiment.

For example, in the above embodiment, although the case in which the first underlying conductive film 52 is formed by nitriding the Ti film 50 is described by way of example, a metal film forming the first underlying conductive film 52 is not limited to a Ti film, and for example, various high melting point metal films may also be used as well as a Ti film. For example, after a tantalum (Ta) film is formed instead of the Ti film 50, the first underlying conductive film 52 may be formed by nitriding the Ta film as with the above-described Ti film 50.

In addition, in the above embodiment, although the case in which the second underlying conductive film 56 is formed by nitriding the Ti film 54 is described by way of example, a metal film forming the second underlying conductive film 56 is not limited to a Ti film, and for example, various high melting point metal films may also be used as well as a Ti film. For example, after a tantalum film is formed instead of the Ti film 54, the second underlying conductive film 56 may be formed by nitriding the Ta film as with the above Ti film 54.

In addition, in the above embodiment, although the case in which a PZT film is used as the ferroelectric film 62 is described by way of example, the ferroelectric film 62 is not limited to a PZT film. Besides a PZT film, for example, a PZT-based ferroelectric film, such as a $Pb_{1-x}La_xZr_{1-y}Ti_yO_3$ film (PLZT film), may also be used as the ferroelectric film 62. In addition, for example, a bismuth layer-structured ferroelectric film, such as an $SrBi_2Ta_2O_9$ film (SBT film), an $SrBi_2(Ta,Nb)_2O_9$ film (SBTN film), a $Bi_4Ti_3O_9$ film, $(Bi,La)_4Ti_3O_{12}$ film, or a $BiFeO_3$ film, may also be used.

In addition, in the above embodiment, although the case in which the ferroelectric film 62 is formed by an MOCVD method or a sputtering method is described by way of example, the method for forming the ferroelectric film 62 is not limited thereto. The ferroelectric film 62 may be appropriately formed using a CVD method, such as an MOCVD method, a sputtering method, a sol-gel method, or the like.

In addition, in the above embodiment, although the case in which the conductive plug 46 is further formed on the conductive plug 36, and in which the ferroelectric capacitor 72 is formed on this conductive plug 46 is described by way of example, the conductive plug 46 may be directly connected to the source or the drain electrode 24b without forming the conductive plug 36.

In addition, in the above embodiment, although the case in which the second underlying conductive film 56 is formed on the first underlying conductive film 52 is described by way of example, the oxygen barrier film 58 may be directly formed on the first underlying conductive film 52 without forming the second underlying conductive film 56.

Furthermore, in the above embodiment, although the case in which in order to nitride the titanium film 50, which is formed into the first underlying conductive film 52, from the lower surface, nitrogen is diffused in the interlayer insulating film 40 is described by way of example, nitrogen may not be diffused in the interlayer insulating film 40, and the titanium film 50 may not be nitrided from the lower surface.

Figure 34:
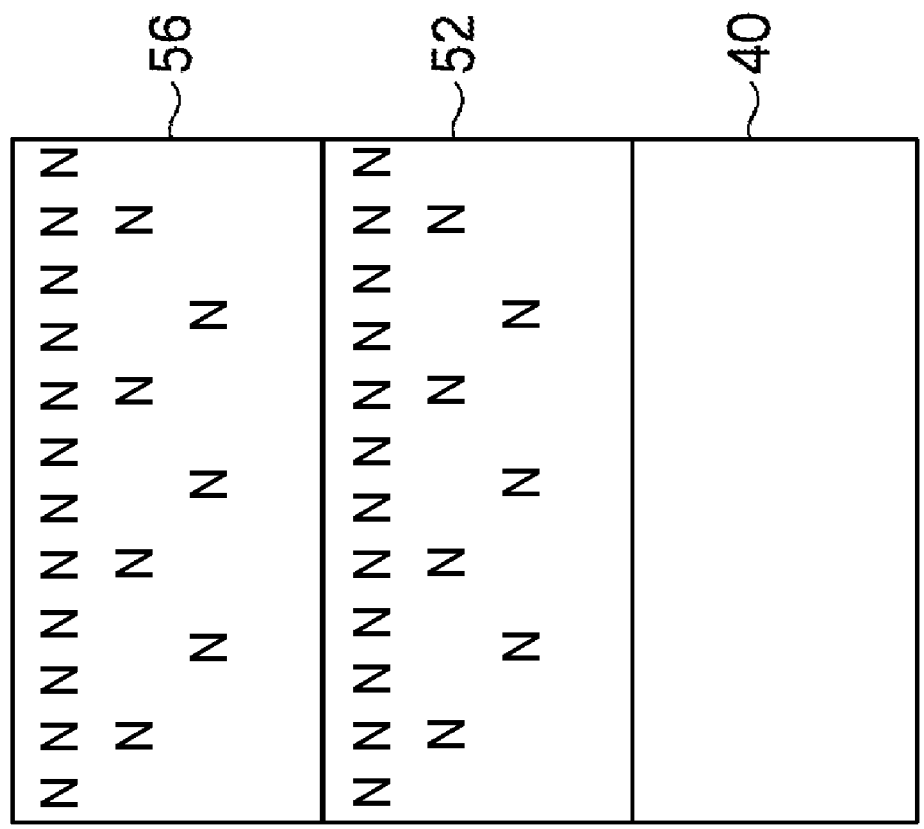
FIG. 34 is a cross-sectional view of a semiconductor device according to a modified embodiment of the present invention.

FIG. 34 is an enlarged cross-sectional view of the interlayer insulating film 40, the first underlying conductive film 52, and the second underlying conductive film 56 when the titanium film 50 is not nitrided from the lower surface. As illustrated in the figure, nitrogen is not diffused in the interlayer insulating film 40. In the region on the interlayer insulating film 40, the first underlying conductive film 52 is nitrided from the upper surface but is not nitrided from the lower surface. That is, the first underlying conductive film 52 is nitrided at the upper layer portion in the region on the interlayer insulating film 40 but is not nitrided at the lower layer portion. As described above, the first underlying conductive film 52 may be formed without nitriding the Ti film 50 from the lower surface.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
an insulating film provided over a semiconductor substrate;
a conductive plug buried in the insulating film;
an underlying conductive film which is provided on the conductive plug and on the insulating film and which has a flat upper surface; and
a ferroelectric capacitor provided on the underlying conductive film,
wherein at least in a region on the conductive plug, the concentration of nitrogen in the underlying conductive film decreases from the upper surface of the underlying conductive film to the inside of the underlying conductive film,
wherein, in a region on the insulating film, the underlying conductive film is nitrided at a lower layer portion thereof, and
wherein the concentration of nitrogen in the underlying conductive film in the region on the conductive plug is lower than the concentration of nitrogen in the underlying conductive film in the region on the insulating film.

2. The semiconductor device according to claim 1,
wherein, in the region on the conductor plug, the underlying conductive film is nitrided only at an upper layer portion thereof.

3. The semiconductor device according to claim 1,
wherein the upper surface of the conductive plug is lower than the upper surface of the insulating film.

4. The semiconductor device according to claim 1,
wherein the concentration of nitrogen in the underlying conductive film in the region on the insulating film gradually decreases from the upper surface to the inside and also gradually decreases from the lower surface to the inside.

5. The semiconductor device according to claim 1,
wherein the insulating film includes nitrogen.

6. The semiconductor device according to claim 5,
wherein the concentration of nitrogen in the insulating film gradually decreases from the upper surface to the inside.

7. The semiconductor device according to claim 1,
wherein the underlying conductive film includes titanium or tantalum.

8. The semiconductor device according to claim 1,
further comprising another underlying conductive film which is nitrided at an upper layer portion thereof and which is provided between the underlying conductive film and the ferroelectric capacitor.

* * * * *